US009800452B2

(12) United States Patent
Lehtinen

(10) Patent No.: US 9,800,452 B2
(45) Date of Patent: Oct. 24, 2017

(54) DIGITAL QUADRATURE MODULATOR AND SWITCHED-CAPACITOR ARRAY CIRCUIT

(71) Applicant: Huawei Technologies Co., Ltd., Shenzhen, Guangdong (CN)

(72) Inventor: Teijo Henrikki Lehtinen, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/487,185

(22) Filed: Apr. 13, 2017

(65) Prior Publication Data

US 2017/0222859 A1    Aug. 3, 2017

Related U.S. Application Data

(63) Continuation of application No. PCT/EP2014/072141, filed on Oct. 15, 2014.

(51) Int. Cl.
  *H03F 3/195* (2006.01)
  *H03F 3/213* (2006.01)
  (Continued)

(52) U.S. Cl.
  CPC .......... *H04L 27/36* (2013.01); *H03D 7/1441* (2013.01); *H03F 3/195* (2013.01); *H03F 3/213* (2013.01);
  (Continued)

(58) Field of Classification Search
  CPC ....... H03C 5/00; H03C 3/40; H03F 2200/331; H03F 3/24; H04L 27/361; H03H 11/1291;
  (Continued)

(56) References Cited

U.S. PATENT DOCUMENTS

2007/0275684 A1    11/2007   Harada et al.
2012/0019328 A1*    1/2012   Shibata ................. H03L 7/0891
                                                             331/34
(Continued)

OTHER PUBLICATIONS

Chao Lu et al., "A 24.7dBm all-digital RF transmitter for multimode broadband applications in 40nm CMOS", Feb. 17-21, 2013.*
(Continued)

*Primary Examiner* — Ross Varndell

(57) ABSTRACT

A digital quadrature modulator holds local oscillator circuitry configured to provide local oscillator signals, and local oscillator polarity logic circuitry configured to select an In-phase and a Quadrature local oscillator signal according to a sign bit of an In-phase control word and a sign bit of a Quadrature control word, respectively. The modulator holds a number of local oscillator control logic circuits, each configured to generate a conditioned signal by gating one or both of the selected local oscillator signals according to values of the In-phase control word and/or values of the Quadrature control word. The modulator has one or more sets of switched-capacitor units, where each unit has an output provided by an output capacitor, and where a signal at the input side of the output capacitor is controlled by a conditioned signal. The outputs of at least two of the switched-capacitor units are combined in a common node.

15 Claims, 24 Drawing Sheets

(51) Int. Cl.
　　　H03D 7/14　　　(2006.01)
　　　H04L 27/36　　(2006.01)
　　　H04L 27/04　　(2006.01)
　　　H04B 1/04　　　(2006.01)
　　　H03H 11/12　　(2006.01)
　　　H03H 21/00　　(2006.01)
　　　H03C 5/00　　　(2006.01)

(52) U.S. Cl.
　　　CPC ............... H04B 1/04 (2013.01); H04L 27/04 (2013.01); *H03C 5/00* (2013.01); *H03D 2200/007* (2013.01); *H03D 2200/0082* (2013.01); *H03F 2200/336* (2013.01); *H03F 2200/451* (2013.01); *H03H 11/1291* (2013.01); *H03H 21/0012* (2013.01); *H03J 2200/10* (2013.01); *H04L 27/361* (2013.01)

(58) Field of Classification Search
　　　CPC ......... H03H 21/0012; H03H 2210/021; H03H 2210/043; H03J 2200/10
　　　See application file for complete search history.

(56) References Cited

U.S. PATENT DOCUMENTS

2014/0211870 A1　　7/2014　Dufrene et al.
2014/0269976 A1*　9/2014　Klepser ............... H04B 7/0413
　　　　　　　　　　　　　　　　　　　　　　　　375/295

OTHER PUBLICATIONS

Alavi, Morteza S., et al., "All-Digital RF I/Q Modulator," IEEE Transactions on Microwave Theory and Techniques, vol. 60, No. 11, Nov. 2012, pp. 3513-3526.

Choi, Hyunseok, et al., "A Digital Polar CMOS Power Amplifier With a 102-dB Power Dynamic Range Using a Digitally Controlled Bias Generator," IEEE Transactions on Microwave Theory and Techniques, IEEE Service Center, Piscataway, NJ, US, vol. 62, No. 3, Mar. 1 2014, pp. 579-589, XP011541866.

Eloranta, Petri, et al., "Direct-Digital RF-Modulator: A Multi-Function Architecture for a System-Independent Radio Transmitter," Integrated Circuits for Communications, IEEE Communications Magazine, Apr. 2008, pp. 144-151.

Yoo, Sang-Min, et al., "A Switched Capacitor RF Power Amplifier," IEEE Journal of Solid State Circuits, vol. 46, No. 12, Dec. 2001, pp. 2977-2987.

* cited by examiner

DIGITAL QUADRATURE MODULATOR AND SWITCHED-CAPACITOR ARRAY CIRCUIT

CROSS-REFERENCE TO RELATED APPLICATIONS

This application is a continuation of International Application No. PCT/EP2014/072141, filed on Oct. 15, 2014, the disclosure of which is hereby incorporated by reference in its entirety.

TECHNICAL FIELD

The present invention relates to the field of data communication, and more particularly to a digital quadrature modulator configuration. The present invention further relates to a switched-capacitor array configuration.

BACKGROUND

Devices that convert digital In-phase (I) and Quadrature (Q) signals directly to In-phase/Quadrature (I/Q) modulated analog Radio-Frequency (RF) power are widespread in use today. Such devices have various names and abbreviations in literature, such as all-digital quadrature transmitter, Direct Digital to RF Modulator (DDRM), Digital to RF Converter (DRFC), Digital to RF Amplitude Converter (DRAC, RF-DAC). In this document the device is called an IQ to RF-power Digital to Analog Converter (IQ-RF-DAC).

A prior art IQ-RF-DAC performance has been achieved by switch-array topology. FIG. 1 shows an example of a switch-array IQ-RF-DAC 100, which is described by Chao Lu et al., see ref. [1]. The switch-array IQ-RF-DAC 100 of FIG. 1 is based on digitally modulating the conductance of switch arrays. Using logic AND gates, incoming digital Baseband (BB) bits control whether a Local Oscillator (LO) signal is reaching a unit switch gate or not.

For the IQ-RF-DAC 100 of FIG. 1, a radio-frequency output, RFout 101, is taken by combining the currents from first and second switch-array power amplifiers, I-PA 102 and Q-PA 103. A transformer 104 is used for combining the outputs of I-PA 102 and Q-PA 103 to RFOut 101. I-PA 102 and Q-PA 103 are identical and respond to In-phase (I) and Quadrature (Q) signals, respectively. Each one is split into multiple power cells 105, 106, discretely controlled by baseband signals. The baseband signal consists of thirteen bits, I-BB[12:0] 107 for the In-phase signal and Q-BB [12:0] 108 for the Quadrature signal, in a signed binary format. BB[12] indicates sign information and the rest of the bits are encoded with signal amplitude to enable the appropriate number of power cells. The sign bit I-BB[12] 109 is fed to a multiplexer 110, which further has as input an In-phase local oscillator signal, I-LO 111, and the sign bit 109 determines whether the positive I-LO signal, LO+ 112, or the inverted or opposite In-phase local oscillator signal, LO− 113, is used for switching switch gates of I-PA 102. The sign bit Q-BB[12] 116 is fed to a multiplexer 117, which further has as input a Quadrature local oscillator signal, Q-LO 118, and the sign bit 116 determines whether the positive Q-LO signal, LO+ 119, or the inverted or opposite Quadrature local oscillator signal, LO− 120, is used for switching switch gates of Q-PA 103. A unit power cell of I-PA and Q-PA 105, 106 is constructed with two AND gates 114, 115 and 121, 122, a switching pair 123, 124 and 125, 126 and its buffers 127, 128 and 129, 130. The enable signal bit, EN 131, 132 of I-BB[11:0] or Q-BB[11:0] is applied as one input of an AND gate 114, 115 and 121, 122, while the other input is connected with signed LO, LO+ 112, 119 or LO− 113, 120. The RF output, RFOut 101, conveys quantized baseband information, and thereby the IQ-RF-DAC 100 of FIG. 1 functions as a combination of digital-to-analog conversion, modulation and power amplification.

SUMMARY

It is an object of the present invention to provide a digital quadrature modulator, which comprises one or more sets or arrays of switched-capacitor units. The switched-capacitor arrays of the present invention, which is very well suited to high-volume CMOS process manufacturing, may replace the switched-array topology of prior art digital quadrature modulators, thereby providing a solution, which can be used for low-cost RF solutions taking advantage of the benefits of CMOS process scaling.

The foregoing and other objects are achieved by the features of the independent claim. Further implementation foims are apparent from the dependent claims, the description and figures.

According to a first aspect, there is provided a digital quadrature modulator comprising: local oscillator circuitry configured to provide a first set of local oscillator signals with a first duty-cycle, which comprises a positive In-phase local oscillator signal an opposite polarity In-phase local oscillator signal (LOIM), a positive Quadrature local oscillator signal, and an opposite polarity Quadrature local oscillator signal; local oscillator polarity logic circuitry configured to select an In-phase local oscillator signal between the positive and opposite polarity In-phase local oscillator signals according to a sign bit of an In-phase digital control word, and to select a Quadrature local oscillator signal between the positive and opposite polarity Quadrature local oscillator signals according to a sign bit of a Quadrature digital control word; a number of local oscillator control logic circuits, each configured to generate a conditioned signal by gating one or both of the selected local oscillator signals according to values of the In-phase digital control word and/or values of the Quadrature digital control word; one or more sets of switched-capacitor units, each switched-capacitor unit having an output provided by an output capacitor, wherein the signal at the input side of the output capacitor is determined or controlled by one of the conditioned signals; and a common node configured to combine the outputs of at least two of the switched-capacitor units.

The output capacitor of the switched-capacitor unit has an input side, which can be connected to or supplied by a signal or voltage, where the signal or voltage on the input side is determined or controlled by one of the conditioned signals. The switched-capacitor units may be arranged in parallel to form an array, and a set of switched-capacitor units may also be referred to as a switched-capacitor array.

The number of local oscillator control circuitry can be less than the number of switched-capacitor units. Using an output of one local oscillator control circuitry to control several switched-capacitor units can reduce the physical layout complexity.

In a first possible implementation form of the digital quadrature modulator according to the first aspect, the local oscillator circuitry is further configured to provide a second set of local oscillator signals with a second duty-cycle, which also comprises a positive In-phase local oscillator signal, an opposite polarity In-phase local oscillator signal, a positive Quadrature local oscillator signal, and an opposite polarity Quadrature local oscillator signal; the local oscillator polarity logic circuitry is further configured to select a second duty-cycle local oscillator signal from the set of provided second duty-cycle local oscillator signals according to the sign bit of the In-phase digital control word and the sign bit of the Quadrature digital control word; and at least part of the local oscillator control logic circuits are configured to generate the conditioned signal by gating the selected first duty-cycle local oscillator signals and the selected second duty-cycle local oscillator signal according to values of the In-phase digital control word and values of the Quadrature digital control word.

In a second possible implementation form of the digital quadrature modulator according to the first implementation form of the first aspect, the second duty-cycle of the second set of local oscillator signals is larger than the first duty-cycle of the first set of local oscillator signals.

In a third possible implementation form of the digital quadrature modulator according to the second implementation form of the first aspect, the second duty-cycle of the second set of local oscillator signals is 50% or about 50%, and the first duty-cycle of the first set of local oscillator signals is 25% or about 25%.

In a fourth possible implementation form of the digital quadrature modulator according to the first aspect as such or according to any of the preceding implementation forms of the first aspect, at least two of the switched-capacitor units have an output capacitor with a first capacitance value, and the output of at least two switched-capacitor units with the first capacitance output value are coupled to each other through one or more series capacitors having a total second capacitance value equal to or substantially equal to twice the first capacitance value. This has the advantage that C-2C switched-capacitor arrays can be formed and used to increase the resolution of the digital quadrature modulator.

In a fifth possible implementation form of the digital quadrature modulator according to the first aspect as such or according to any of the preceding implementation forms of the first aspect, part or all of the switched-capacitor units are multi-voltage switched-capacitor units, which are configured to connect with at least two supply voltages, with at least a second supply voltage being higher than a first supply voltage. This has the advantage that one or more switched-capacitor arrays holding multi-voltage switched capacitor units can be formed, and the back-off power efficiency (PAE) of the digital quadrature modulator can be improved.

In a sixth possible implementation form of the digital quadrature modulator according to the fifth implementation form of the first aspect, the digital quadrature modulator further comprises voltage selection circuitry configured to select the supply voltage of the multi-voltage switched-capacitor units in accordance with one or more received supply voltage selection signals.

In a seventh possible implementation form of the digital quadrature modulator according to the first aspect as such or according to any of the preceding implementation forms of the first aspect, part or all of the switched-capacitor units are off-mode switched-capacitor units configured to have controllable operation modes including an off-mode, an active voltage switching mode, and a passive constant input voltage mode. In the off-mode the input side of the output capacitor is floating with a small parasitic output capacitance, which may be regarded as nearly zero, while for the active and passive modes the output capacitance is equal to a capacitance of an output capacitor of the switched-capacitor unit. Applying off-mode switched-capacitor units can be useful for adjusting total output capacitance of a switched-capacitor array within the digital quadrature modulator.

In an eighth possible implementation form of the digital quadrature modulator according to the seventh implementation form of the first aspect, the modulator further comprises an operation mode control circuitry configured to control the operation mode of the off-mode switched-capacitor units in accordance with one or more operation mode control signals.

In a ninth possible implementation form of the digital quadrature modulator according to the seventh or the eighth implementation form of the first aspect, a first set of the off-mode switched-capacitor units are configured for having an input side of the output capacitor switching between ground and a third supply voltage when in the active mode, and a second set of the off-mode switched-capacitor units are configured for having an input side of the output capacitor switching between ground and a fourth supply voltage when in the active mode, the fourth supply voltage being higher than the third supply voltage.

In a tenth possible implementation form of the digital quadrature modulator according to the eighth and ninth implementation forms of the first aspect, the operation mode control circuitry is configured to control the operation mode of the first and second set of off-mode switched-capacitor units so that when the operation mode of a number of the second set of off-mode switched-capacitor units are controlled to be in the off-mode, then the operation mode of an equal or greater number of the first set of off-mode switched-capacitor units are controlled to be in the passive or active mode.

In an eleventh possible implementation form of the digital quadrature modulator according to the tenth implementation form of the first aspect, the operation mode control circuitry is configured to control the operation mode of the first and second set of off-mode switched-capacitor units so that when the operation mode of a number of the second set of off-mode switched-capacitor units are controlled to shift from off-mode to active mode, then the operation mode of an equal number of the first set of off-mode switched-capacitor units are controlled to shift from passive or active mode to off-mode.

In a twelfth possible implementation form of the digital quadrature modulator according to the eighth and any of the ninth, the tenth, or the eleventh implementation forms of the first aspect, the operation mode control circuitry is configured to control the operation mode of the first and second set of off-mode switched-capacitor units so that when the operation mode of a number of the second set of off-mode switched-capacitor units are controlled to shift from active mode to off-mode, then the operation mode of an equal number of the first set of off-mode switched-capacitor units are controlled to shift from off-mode to passive or active mode.

In a thirteenth possible implementation form of the digital quadrature modulator according to any of the eighth, the ninth, the tenth, the eleventh, or the twelfth implementation forms of the first aspect, the operation mode control circuitry is configured to set the operation mode of a number of off-mode switched-capacitor units in the off-mode, to thereby change the overall output capacitance.

According to a second aspect, there is provided a RF transmitter comprising a digital quadrature modulator of one of the preceding forms of the first aspect.

In a first possible implementation form of the RF transmitter according to the second aspect, the RF transmitter further comprises a filter or matching network configured to receive the combined output signal and generate a filtered RF output therefrom.

In a second possible implementation form of the RF transmitter according to the second aspect as such or according to the first implementation form of the second aspect, the RF transmitter further comprises a power amplifier configured to receive the combined output signal or the filtered RF output and generate an amplified output therefrom.

According to a third aspect, there is provided a combined transmitter comprising several RF transmitters of the first implementation form of the RF transmitter of the second aspect, wherein RF transmitter output powers are combined.

According to a fourth aspect, there is provided a RF transmitter comprising one, two or more phase modulators, wherein each phase modulator comprises a digital quadrature modulator of one of the preceding forms of the first aspect.

The In-phase digital control word and the Quadrature digital control word are signed digital words, which can contain information about the sign and the magnitude of a corresponding In-phase output RF signal and a corresponding Quadrature output RF signal, respectively. In a simple case, the digital control word can be a signed binary presentation of a number presenting the corresponding output RF signal level. But the digital control word can also contain more control information. For example it can include information about the unit coding, such as taking into account unary and binary coded units, C-2C units, and control information for the operation mode control circuitry for units having e.g. off-mode or several selectable supply voltages. The values of the digital control word mean the unit control information excluding the sign information. The In-phase digital control word and the Quadrature digital control word refer to the in-phase and quadrature signals, but not necessary directly to the I/Q baseband signal. The I/Q baseband signal usually needs to be digitally processed before it can be used to control an IQ-RF-DAC. Typical digital processing can include but is not restricted to up-sampling, digital filtering, pre-distortion, and binary-to-unary conversion.

DETAILED DESCRIPTION

To reduce the RF product cost, there is strong attempt to integrate more and more parts of the RF transmitter chain using high-volume standard CMOS process technologies. The most eligible future low-cost RF solutions benefits from the CMOS process scaling. An excellent example of such is a switched-capacitor digital quadrature modulator power amplifier.

Figure 2:
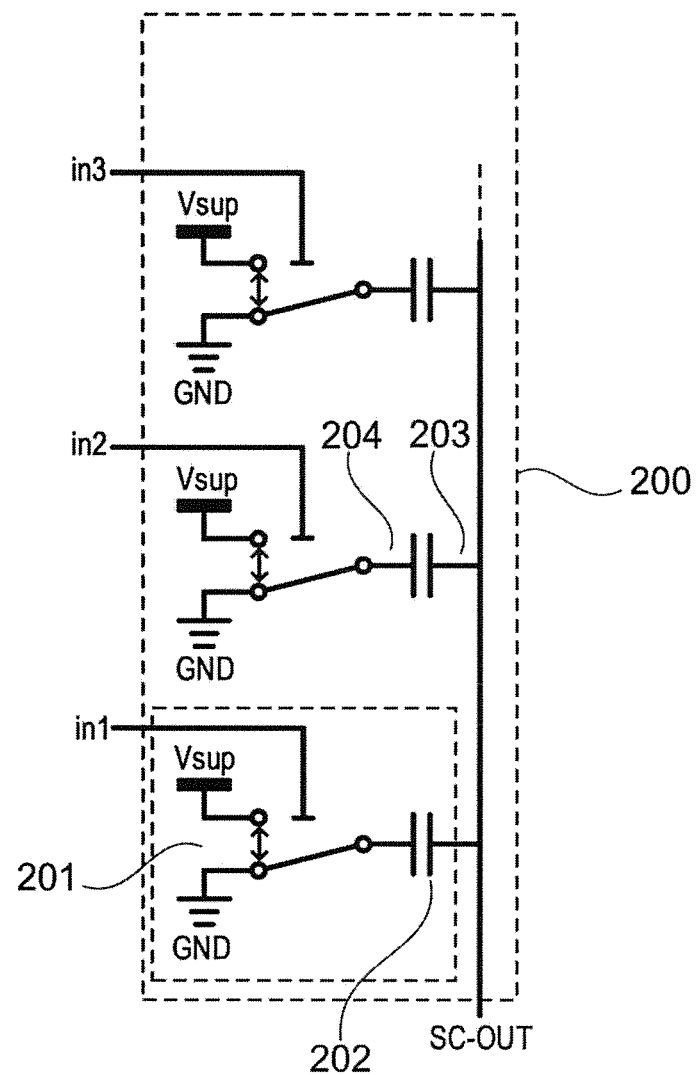
FIG. 2 illustrates a switched-capacitor array comprising switched-capacitor units.

According to an aspect of the present invention there is provided a switched-capacitor digital quadrature modulator. The modulator of the invention may be used in a switched-capacitor IQ-RF-DAC. FIG. 2 shows the concept of a switched-capacitor array 200 comprising switched-capacitor units 201. Each switched-capacitor unit 201 in the array 200 of FIG. 2 has an output capacitor 202, with the outputs 203 of the output capacitors 202 being connected in parallel. The output capacitor 201 has an input side 204, which can be active switching between supply, Vsup, and ground, GND, at a frequency, which can be a local oscillator, LO, frequency, or passive fixed to the supply or ground. In order to control the switching of the switched-capacitor unit 200 of FIG. 2, a switch gate or inverter may be connected to the input side of the output capacitor, and gate circuitry, which may be an AND gate, may be connected to the input in1, in2, in3 of the switch gate or inverter, whereby the input signals to the gate circuitry or AND gate may control switching of the switched-capacitor unit 200.

The input side 204 of the switched-capacitor output capacitor 202 may physically be a bottom plate, and an output side 203 of the capacitor 202 may then be the top plate, but an opposite physical connection to the capacitor 202 is also possible, where the input side 204 is physically the top plate and the output 203 physically the bottom plate.

Or the output capacitor 202 may not have a clear bottom or top plate. One example of such is a coplanar capacitor.

Figure 3:
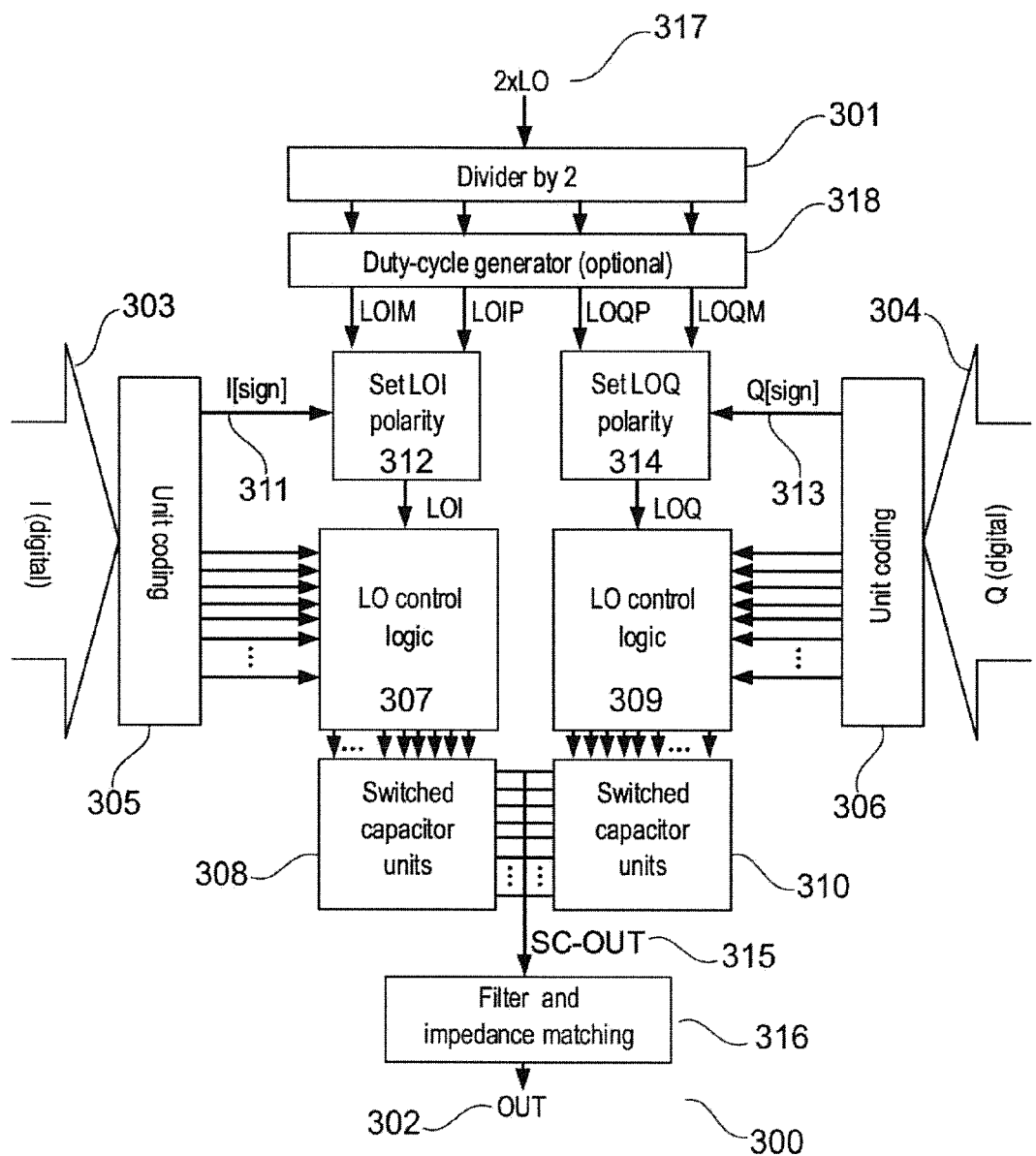
FIG. 3 is a block diagram illustrating a first type IQ-RF-DAC, using a switched-capacitor digital quadrature modulator in accordance with an embodiment of the present invention.

FIG. 3 is a high level block diagram illustrating a first type of switched-capacitor IQ to RF-power DAC 300, IQ-RF-DAC, using a switched-capacitor digital quadrature modulator in accordance with an embodiment of the present invention. The converter of FIG. 3 has an oscillator input 317, 2×LO, with twice the LO frequency, followed by a "divider by 2", to divide the frequency by 2, the "divider by 2" is a part of a local oscillator circuit 301 configured to provide an In-phase local oscillator signal (LOIP), an inverted or opposite polarity In-phase local oscillator signal (LOIM), a Quadrature local oscillator signal (LOQP), and an inverted or opposite polarity Quadrature local oscillator signal (LOQM). The outputs from the divider 301 may be of 50% duty-cycle, and a duty-cycle generator 318 may optionally be provided if another duty-cycle, such as a 25% duty cycle is needed for the LO frequency outputs, LOIM, LOIP, LOQP, LOQM.

The output 302 of the converter of FIG. 3, OUT, is responsive to a digital In-phase (I) signal 303, and a digital Quadrature (Q) signal 304. The digital signals 303, 304, I and Q, each consists of a digital control word, which goes through an In-phase 'Unit coding' circuit 305 and a Quadrature 'Unit coding" circuit 306, respectively. The outputs of the In-phase 'Unit coding' circuit 305 are fed to In-phase logic circuitry or AND ports 307 to be gated together with the In-phase local oscillator signal, LOIP or LOIM. The output of the In-phase AND ports 307 are controlling inputs of In-phase 'Switched capacitor units' 308. The outputs of the Quadrature 'Unit coding' circuit 306 are fed to Quadrature logic circuitry or AND ports 309 to be gated together with the Quadrature local oscillator signal, LOQP or LOQM. The output of the Quadrature AND ports are controlling inputs of Quadrature 'Switched capacitor units' 310. One bit 311 of the In-phase signal, I[sign], indicates sign information for the corresponding local oscillator signal, LOIP, LOIM, and the I[sign] bit 311 is fed to a 'Set LOI polarity' circuit 312 for determining whether the LOIP or LOIM oscillator signal is forwarded to the In-phase AND ports 307. One bit 313 of the Quadrature signal, Q[sign], indicates sign information for the corresponding local oscillator signal, LOQP, LOQM, and the Q[sign] bit 313 is fed to a 'Set LOQ polarity' circuit 314 for determining whether the LOQP or LOQM oscillator signal is forwarded to the Quadrature AND ports 309. The outputs of the In-phase 'Switched capacitor units' 308 are connected in parallel and further connected to parallel connected outputs of the Quadrature 'Switched capacitor units' 310, thereby providing a common node array output 315 (SC-OUT) which is fed to a 'Filter and impedance matching' circuit 316 to provide the converter output 302, OUT.

Figure 4:
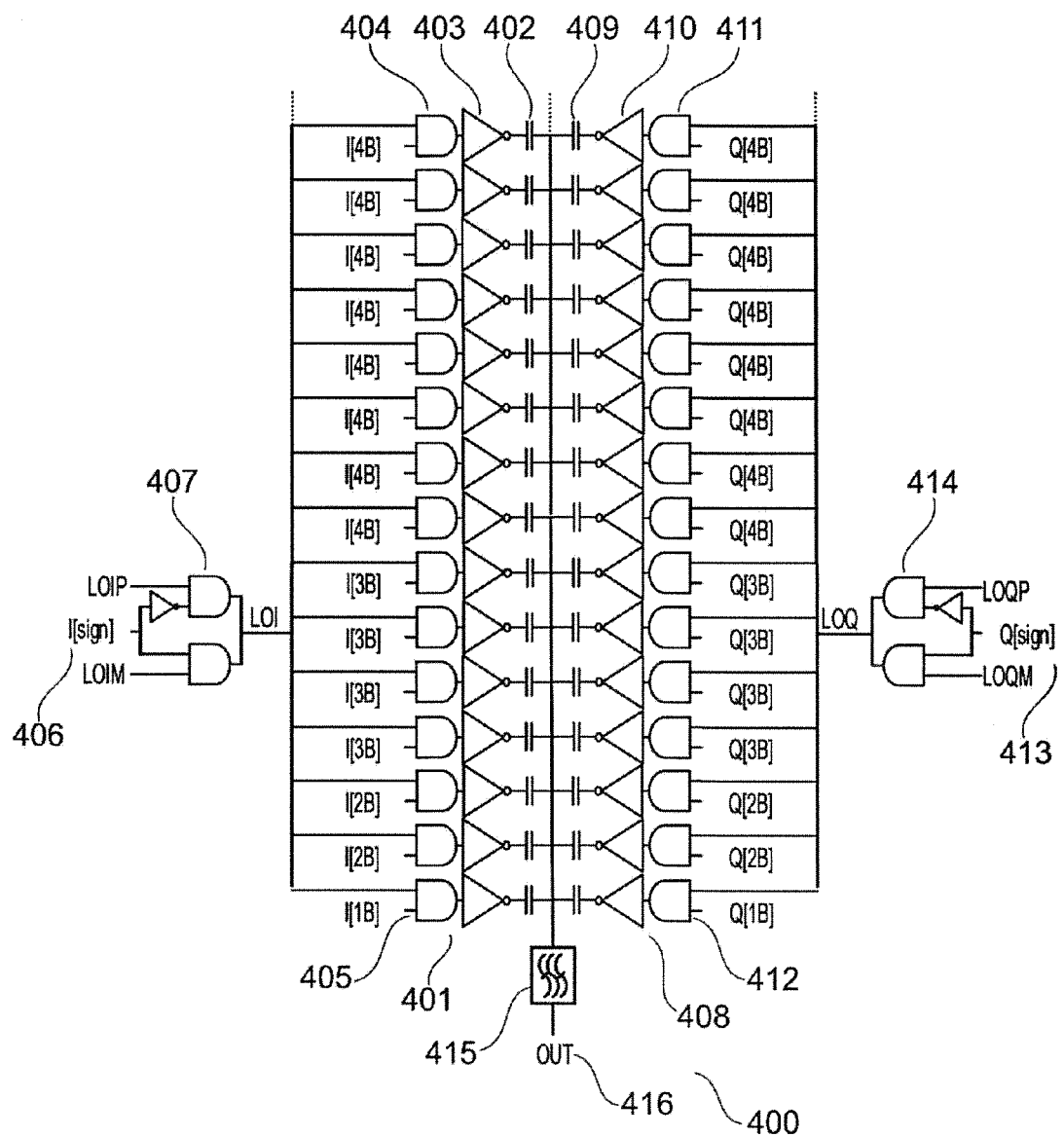
FIG. 4 is a circuit diagram illustrating a switched-capacitor digital quadrature modulator in accordance with a first embodiment of the invention.

FIG. 4 shows a simplified circuit diagram illustrating a switched-capacitor digital quadrature modulator 400 in accordance with a first embodiment of the invention. The modulator 400 of FIG. 4 is configured for use in the switched-capacitor IQ-RF-DAC 300 of FIG. 3. The left side of the diagram of FIG. 4 shows a number of parallel connected In-phase switched-capacitor units 401, corresponding to the In-phase 'Switched capacitor units' 308 of FIG. 3, where each switched-capacitor unit 401 has an output capacitor 402 and an inverter 403 or complementary class-D amplifier. A number of In-phase AND gates 404, corresponding to the In-phase AND ports 307 of FIG. 3, are driving the In-phase switched-capacitor units 401, with an enable input 405 to each of the In-phase AND gates 404 being supplied by an In-phase signal bit I[1 B], I[2 B] etc., where the I bit signals may be coded via the In-phase 'Unit coding" circuit 305 of FIG. 3. An In-phase sign bit 406, I[sign], is fed to an In-phase polarity selection circuit 407, which can comprise two AND gates and an inverter, and which may correspond to the In-phase 'Set LOI polarity" circuit 312 of FIG. 3. The In-phase sign bit 406 controls whether the LOIP or LOIM oscillator signal is forwarded to the In-phase AND gates 404.

The right side of the diagram of FIG. 4 shows a number of parallel connected Quadrature switched-capacitor units 408, corresponding to the Quadrature ° Switched capacitor units' 310 of FIG. 3, where each switched-capacitor unit 408 has an output capacitor 409 and an inverter 410 or class-D amplifier. A number of Quadrature AND gates 411, corresponding to the Quadrature AND ports 309 of FIG. 3, are driving the Quadrature switched-capacitor units 408, with an enable input 412 to each of the Quadrature AND gates 411 being supplied by a Quadrature signal bit Q[1 B], Q[2 B]etc., where the Q bit signals may be coded via the Quadrature 'Unit coding" circuit 306 of FIG. 3. A Quadrature sign bit 413, Q[sign], is fed to a Quadrature polarity selection circuit 414, which can comprise two AND gates and an inverter, and which may correspond to the Quadrature 'Set LOQ polarity" circuit 314 of FIG. 3. The Quadrature sign bit 413 controls whether the LOQP or LOQM oscillator signal is forwarded to the Quadrature AND gates 411. The parallel connected outputs of the In-phase switched-capacitor units 401 are further connected to the parallel connected outputs of the Quadrature switched-capacitor units 408, and the combined output is fed to a filter and impedance matching circuit 415 to provide the converter output 416, OUT.

For the circuit 400 of FIG. 4, only four LSB bits and the sign bits are shown, where 1 B, 2 B ... refers to the first and second least significant bits (LSB). The In-phase and Quadrature control words controlling the switched-capacitor units can be coded in different ways (e.g., instead of binary-coding all or part of the units can be unary-coded (thermo-coded)). The signs of the digital I and Q signals control the polarity of the In-phase LO signal (LOI) and the Quadrature LO signal (LOQ).

Figure 1:
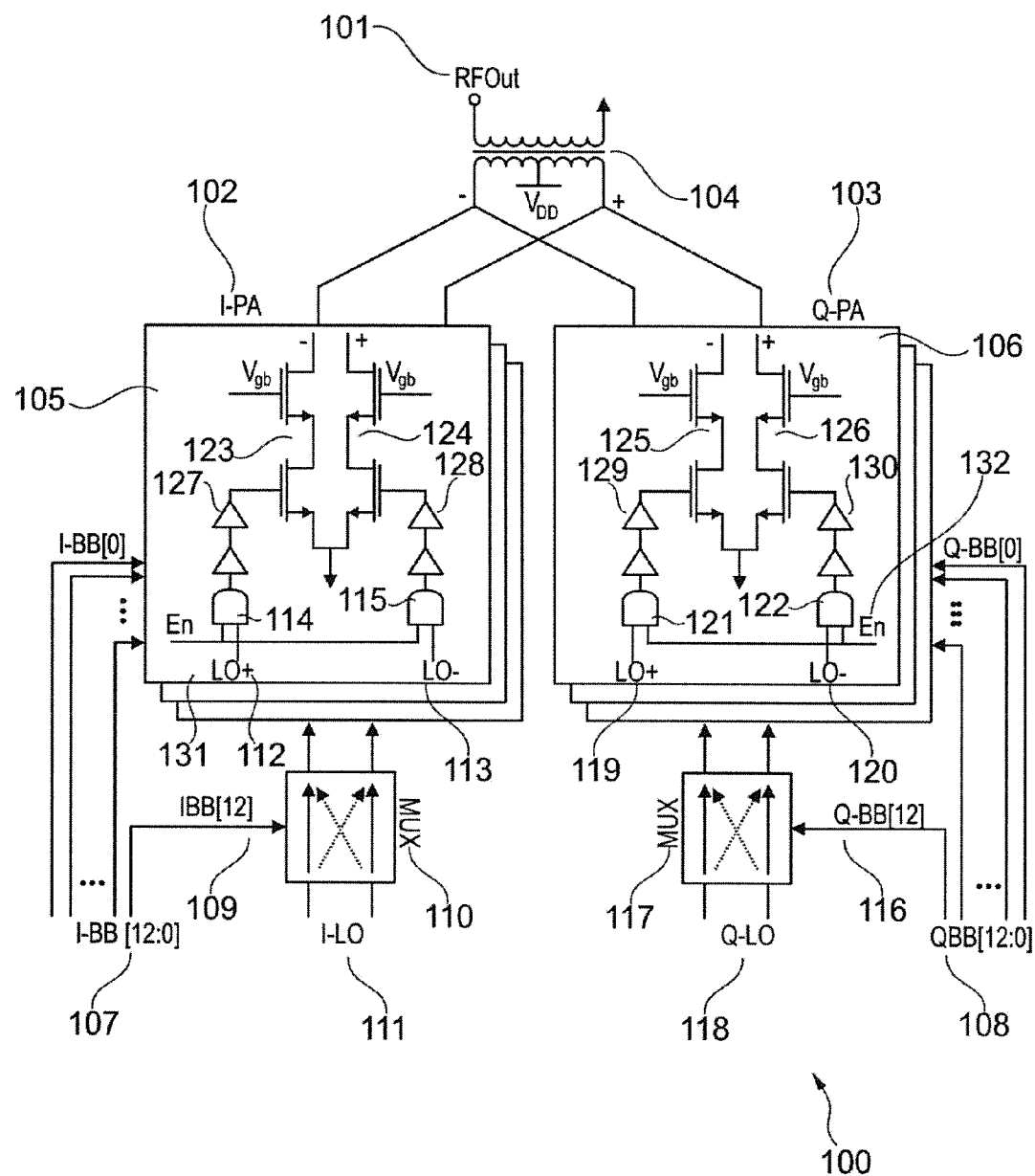
FIG. 1 is a block diagram illustrating a prior art switch-array IQ-RF-DAC.

For the switched-capacitors arrays 308, 309 and 401, 408 of FIGS. 3 and 4, having parallel connected switched-capacitor units, then ideally the switched-capacitor unit capacitance is the same whether the switched-capacitor unit is switching or fixed, so that the effective capacitance of the switched-capacitor array does not depend on the code, and the fundamental linearity and orthogonality will be very good. Also for production process variation, unit-to-unit matching and temperature invariance are remarkably better for unit capacitors than for unit ON-resistances used in prior art switch-array IQ-RF-DAC, such as described in connection with FIG. 1 of ref. [1].

In FIGS. 3 and 4 the switched-capacitor units 401, 408 are divided in two groups or arrays having separate inputs, with a first group being the In-phase switched-capacitor units 401, corresponding to the In-phase 'Switched capacitor units' 308 of FIG. 3, and the second group being the Quadrature switched-capacitor units 408, corresponding to the Quadrature 'Switched capacitor units' 310 of FIG. 3. However, the switched-capacitor units do not need to be dedicated either to the In-phase LOI or the Quadrature LOQ. Instead, if all or most switched-capacitor units can be configured to be switching either with LOI clock or LOQ clock, then a higher peak output power and less power back-off can be obtained from the same switched-capacitor array. Examples of converters having switched-capacitor units configured to be clocked by both the In-phase and Quadrature local oscillator signals are described in connection with FIGS. 5 and 6.

Figure 5A:
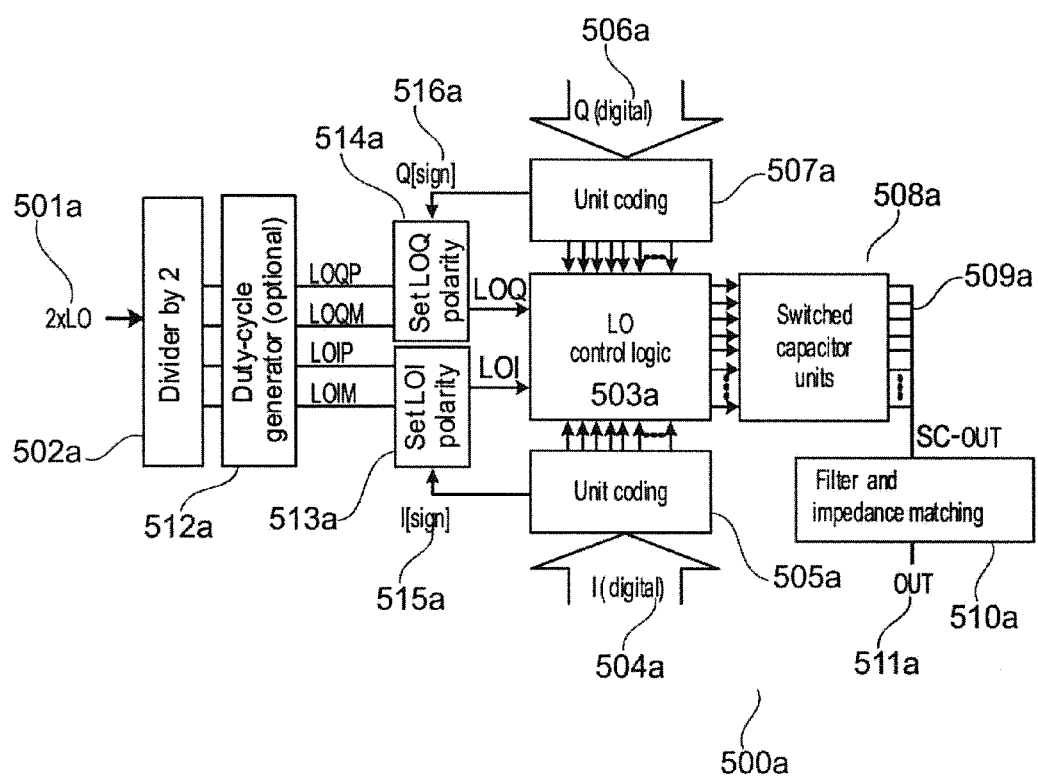
FIGS. 5a and 5b are block diagrams illustrating embodiments of a second type switched-capacitor IQ-RF-DAC, using a digital quadrature modulator in accordance with an embodiment of the present invention.
Figure 5B:
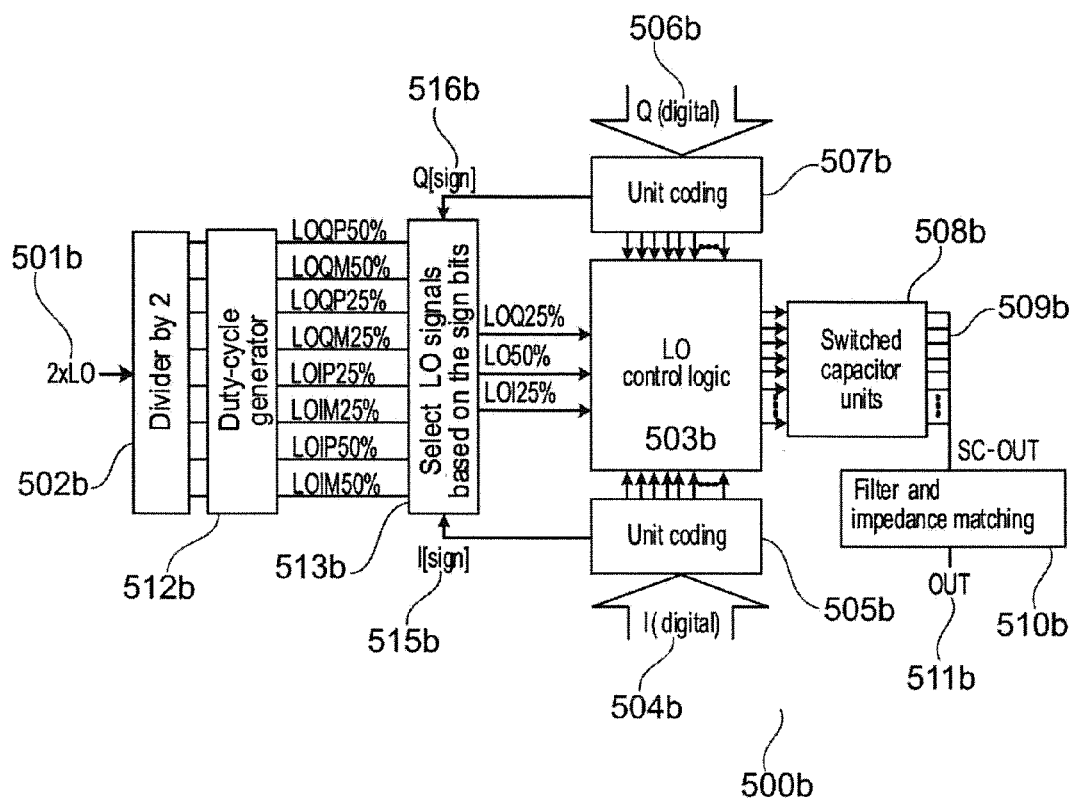

FIGS. 5a and 5b are high level block diagrams illustrating a second type of switched-capacitor IQ-RF-DAC 500a,b using a digital quadrature modulator in accordance with an embodiment of the present invention. The input-output signals of the converters of FIGS. 5a, 5b are similar to the input-output signals of the converters of FIGS. 3 and 4. The converters of FIGS. 5a, 5b have an oscillator input 501a,b, 2×LO, with twice the LO frequency, followed by a 'Divider by 2' local oscillator circuit 502a,b configured to provide an In-phase local oscillator signal (LOIP), an inverted or opposite polarity In-phase local oscillator signal (LOIM), a Quadrature local oscillator signal (LOQP), and an inverted or opposite polarity Quadrature local oscillator signal (LOQM). The outputs from the divider 502a,b may be of 50% duty-cycle, and a duty-cycle generator 512a,b, may optionally be provided if another duty-cycle, such as a 25% duty cycle, is needed for the LO frequency outputs, LOIM, LOIP, LOQP, LOQM.

In FIG. 5a, the LOIM and LOIP signals are fed to a 'Set LOI polarity' circuit 513a, and the LOQM and LOQP signals are fed to a 'Set LOQ polarity' circuit 514a. Selected LOI and LOQ output frequency signals are fed from circuit 513a and 514a, respectively, to a 'LO control logic' circuit 503a.

In FIG. 5b, the duty-cycle generator 512b is not optional, and both 50% and 25% duty cycle LO frequency outputs, LOIM, LOIP, LOQP, LOQM are fed to a 'Select LO signals based on the sign bits' circuit 513b. Two 25% duty-cycle output frequency signals, LOQ25% and LOI25% are fed from circuit 513b to the 'LO control logic' circuit 503b, and one 50% duty-cycle output frequency signal, LO50%, is fed from circuit 513b to the 'LO control logic' circuit 503b.

For both converters of FIGS. 5a and 5b, the In-phase baseband signal 504a,b, I(digital), goes through an In-phase 'Unit coding' circuit 505a,b, and the outputs from the In-phase 'Unit coding' circuit are fed to the 'LO control logic' circuit 503a,b. For the 'Unit coding' circuit 505a the sign bit, I[sign] 515a, is fed to the 'Set LOI polarity' circuit 513a. Similar, the Quadrature baseband signal 506a,b, Q(digital), goes through a Quadrature 'Unit coding' circuit 507a,b, and the outputs from the Quadrature 'Unit coding' circuit 507a,b are fed to the 'LO control logic' circuit 503a,b. For the 'Unit coding' circuit 507a the sign bit, Q[sign] 516a, is fed to the 'Set LOQ polarity' circuit 514a. The sign bits 515a and 516a controls the polarity of the LOI and LOQ frequency signals being fed to the 'LO control logic' 503a.

For the 'Unit coding' circuits' 505b and 507b the sign bits, I[sign] 515b and Q[sign] 516b, are both fed to the 'Select LO signals based on the sign bits' circuit 513b. The sign bits 515b and 516b control the polarity of the LOI25% and LOQ25% frequency signals being fed to the 'LO control logic' 503b, and further controls which 50% duty-cycle LOIM, LOIP, LOQP, LOQM signal, is fed as LO50% to the circuit 503b.

The outputs of the 'LO control logic' circuit 503a,b are used as inputs for an array of parallel connected switched-capacitor units 508a,b, 'Switched capacitor units'. The output of the parallel connected units of the 'Switched capacitor units' 508a,b is a common node array output 509a,b, SC-OUT, which is fed to a 'Filter and impedance matching" circuit 510a,b to provide the converter output 511a,b (OUT).

The present invention also convers embodiments, for which only part of the switched-capacitor unit outputs are combined in a common node, such as 315, 509a, 509b, and received by a filter or matching network, such as 316, 415, 510a, 510b. Here, the remaining switched-capacitor unit outputs may be combined with the output, such as 302, 416, 511a, 511b, of the filter or matching network.

Figure 6A:
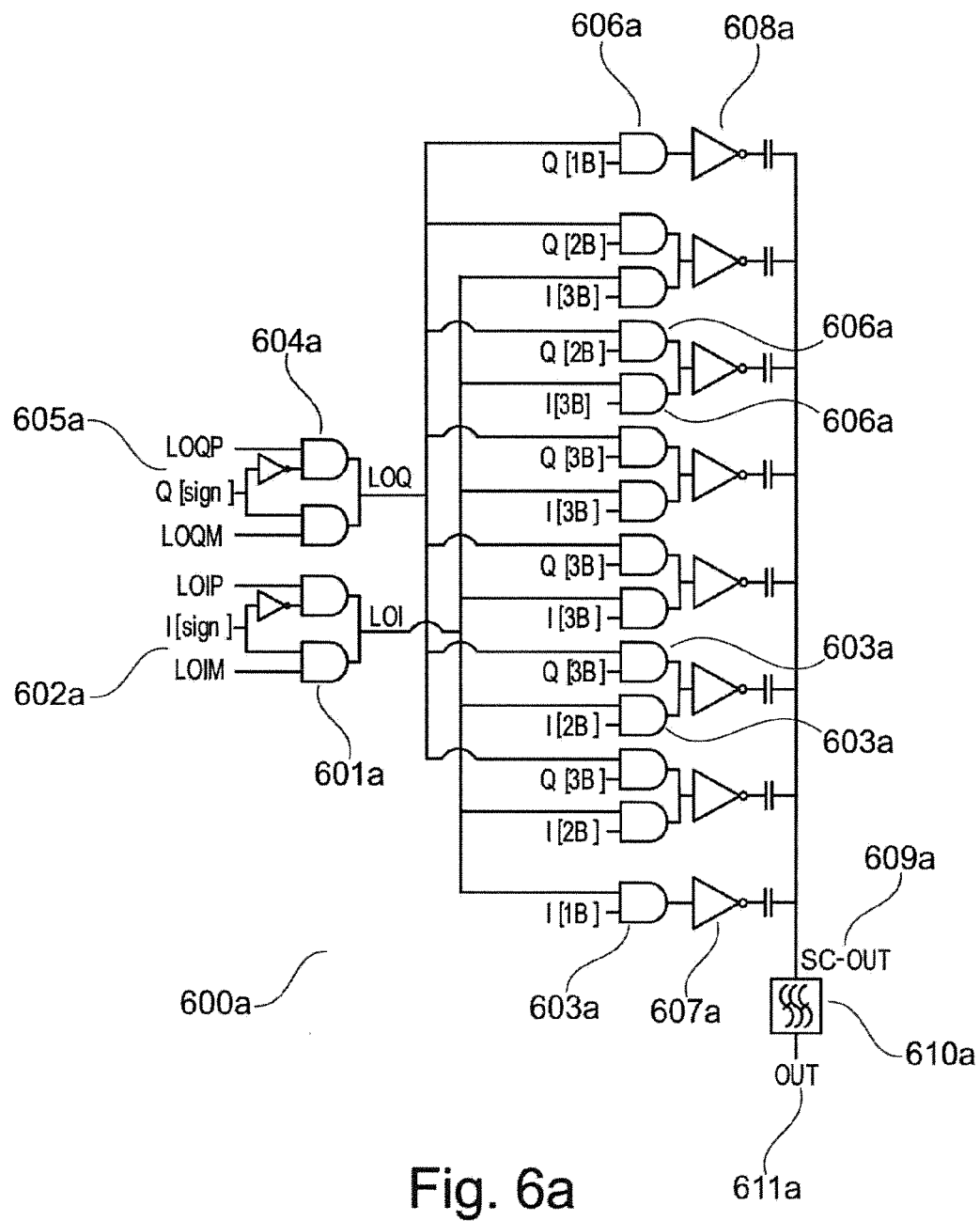
FIGS. 6a and 6b are circuit diagrams illustrating embodiments of a switched-capacitor digital quadrature modulator in accordance with the second type of converters.
Figure 6B:
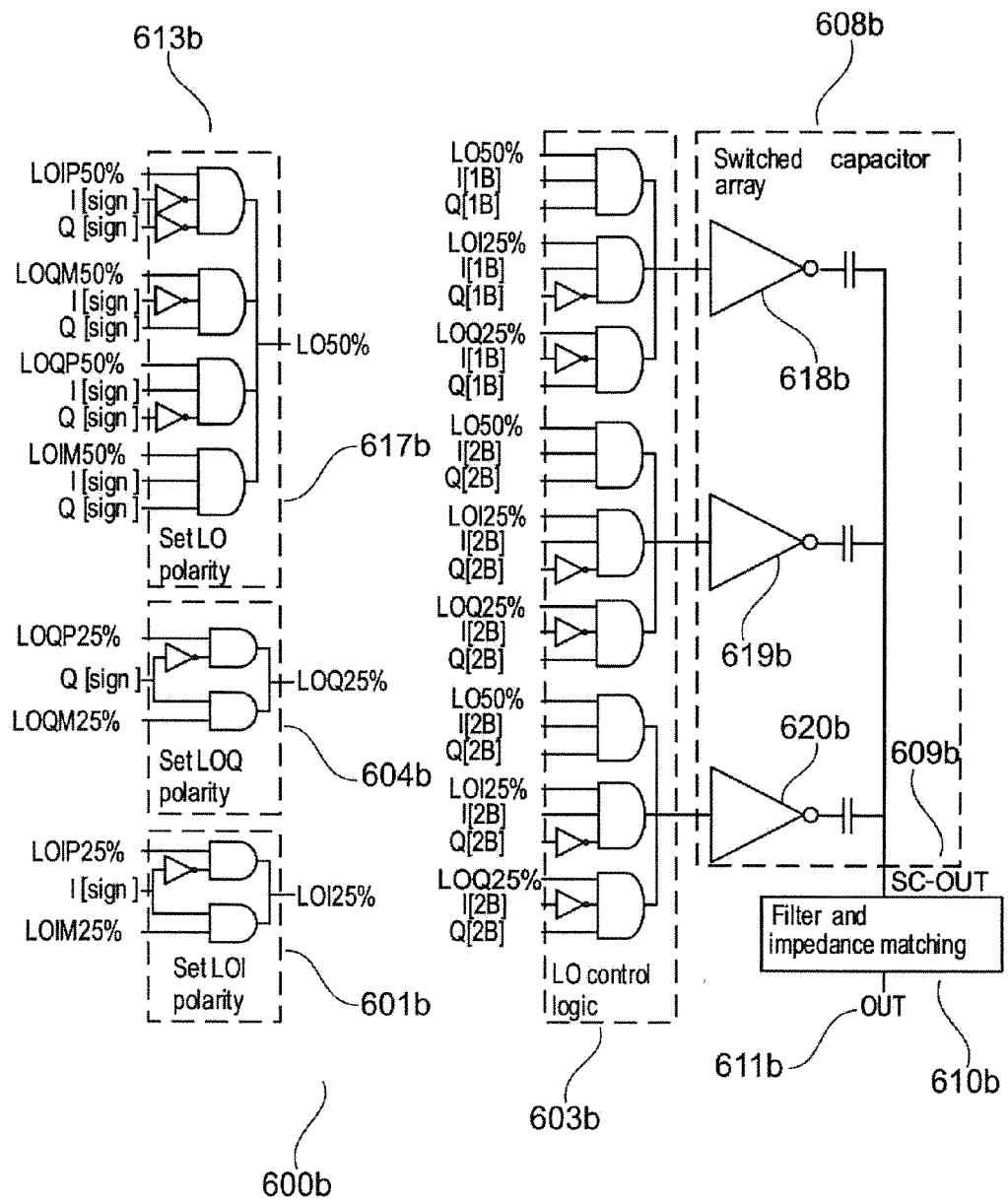

FIGS. 6a and 6b are circuit diagrams illustrating embodiments of a switched-capacitor digital quadrature modulator in accordance with the second type of converters, where FIG. 6a corresponds to the block diagram of FIG. 5a and FIG. 6b corresponds to the block diagram of FIG. 5b.

The modulator 600a of FIG. 6 shows an example of the 'LO control logic' circuit 503a, the 'Switched capacitor units' circuit 508a, and the "Filter and impedance matching' circuit 510a of FIG. 5a. The circuit diagram of FIG. 6a shows a simplified embodiment of a 3-bit SC-IQ-RF-DAC where all but the LSB bits of the incoming baseband signals, I and Q, can be configured to either LOI or LOQ. The diagram of FIG. 6a shows an In-phase polarity selection circuit 601a with two AND gates and an inverter, where the In-phase sign bit 602a, I[sign], controls whether the LOIP or the LOIM oscillator signal is forwarded to each of a number of In-phase AND gates 603a. Each In-phase AND gate 603a is connected to an input of a switched-capacitor unit having an output capacitor. The diagram of FIG. 6a also contains a Quadrature polarity selection circuit 604a with two AND gates and an inverter, where the Quadrature sign bit 605a, Q[sign], controls whether the LOQP or the LOQM oscillator signal is forwarded to each of a number of Quadrature AND gates 606a. Each Quadrature AND gate 606a is connected to an input of a switched-capacitor unit having an output capacitor. One of the switched-capacitor units 607a is controlled by one In-phase AND gate 603aa, which besides the In-phase oscillator signal, LOIM or LOIP, has as input the first bit of the In-phase baseband signal, I[1B]. Similarly, one of the switched-capacitor units 608a is controlled by one Quadrature AND gate 606aa, which besides the Quadrature oscillator signal, LOQM or LOQP, has as input the first bit of the Quadrature baseband signal, Q[1B]. For each of the remaining switched-capacitor units, the switched-capacitor unit is connected with a LO control logic circuit, which comprises both an In-phase AND gate 603a having as input the second or third bit of the In-phase signal, I[2B] or I[3B], and a Quadrature AND gate 606a having as input the second or third bit of the Quadrature signal, Q[2B] or Q[3B]. The output 609a of the parallel connected switched-capacitor units, SC-OUT, is fed to a 'Filter and impedance matching" circuit 610a to provide the converter output 611a, OUT. The switched-capacitor units being connected to both In-phase and Quadrature AND gates 603a, 606a cannot be connected to the In-phase or Quadrature oscillator signals, LOI and LOQ, at the same time, so binary-coding may limit the practical number of shared switched-capacitor units, but in actual implementation the MSB bits may be unary-coded to avoid glitches, which may also significantly reduce the I and Q control overlapping.

The diagram of FIG. 6b shows a modulator 600b holding a 'Select LO signals based on the sign bits' circuit 613b, a 'LO control logic' circuitry 603b, a 'Switched capacitor array' 608b, with an output 609b (SC-OUT), which is fed to a 'Filter and impedance matching' circuit 610b to provide the converter output 611b, OUT. These parts correspond to 513b, 503b, 508b, 509b, 510b and 511b, respectively, of FIG. 5b.

The circuit 613b of the modulator 600b holds an In-phase polarity selection circuit, 'Set LOI polarity' circuit 601b, with 25% duty cycle inputs LOIP25% and LOIM25% from 512b, and with sign bit I[sign] controlling an output signal LOI25%, and a Quadrature polarity selection circuit, 'Set LOQ polarity' circuit 604b, with 25% duty cycle inputs LOQP25% and LOQM25% from 512b, and with sign bit Q[sign] controlling an output signal LOQ25%. Circuit 613b further holds a 'Set LO polarity' circuit 617b. The circuit 617b has the 50% duty cycle inputs, LOIM50%, LOIP50%, LOQM50%, LOQP50% from 512b, and the sign bits I[sign] and Q[sign] controlling an output signal LO50%.

As shown in FIG. 6b, the 'LO control logic' circuitry 603b comprises three 'LO control logic circuit' units each controlling one switched-capacitor unit. The circuit 603b holds control logic for controlling switching of switched-capacitor units 618b, 619b, and 620b of array 608b. For unit 618b, the LO control logic circuit has as inputs first bit baseband signals representing both the In-phase and the Quadrature signals, I[1B] and Q[1B], together with the LO50%, LOI25% and LOQ25% local oscillator signals. For each unit 619b and 620b, the LO control logic circuit has as inputs second bit baseband signals representing both the In-phase and the Quadrature signals, I[2B] and Q[2B], together with the LO50%, LOI25% and LOQ25% local oscillator signals.

The LOI and LOQ polarity circuits 601b and 604b, output 25% duty-cycle local oscillator signals LOI25% and LOQ25% depending on I[sign] and Q[sign], respectively. The LO50% circuit 617b selects one 50% duty-cycle local oscillator signal, depending on both I[sign] and Q[sign]. Then the LO control logic circuitry 603b uses both the 50% duty-cycle and 25% duty-cycle local oscillator signals, LO50%, LOI25%, LOQ25%, and selects the optimum one from those three options depending on the digital baseband words. The optimum signal selected for each switched-capacitor unit is called a conditioned signal. The advantage is that with any arbitrary I and Q signal words, maximum amount of switched-capacitor units can be operated with the optimum 50% duty-cycle and with no signal cancellation at the output.

As illustrated in FIG. 6b the local oscillator (LO) polarity logic circuitry comprises a LOI polarity logic circuit, a LOQ polarity logic circuit, and a LO polarity logic circuit, shown as 'Set LOI polarity' 601b, 'Set LOQ polarity' 604b, and 'Set LO polarity' 617b, respectively. The LOI polarity logic circuit 601b is configured to select an In-phase local oscillator (LOI) signal between the LOIP and LOIM signals with the first duty-cycle according to a sign of an In-phase digital control word (I). The LOQ polarity logic circuit 604b is configured to select a Quadrature local oscillator (LOQ) signal between the LOQP and LOQM signals with the first duty-cycle according to a sign of a Quadrature digital control word (Q). The LO control logic circuit 617b is configured to select a LO signal among the LO signals with the second duty-cycle according to the signs of the In-phase digital control word (I) and the sign of the Quadrature digital control word (Q).

As illustrated in FIG. 4, FIG. 6a and FIG. 6b, respectively, each local oscillator control logic circuit may be configured to generate a conditioned signal based on the LOI signal with the first duty-cycle and values of the In-phase digital control word (I) or to generate a conditioned signal based on the LOQ signal with the first duty-cycle and values of the Quadrature digital control word (Q); or to generate a conditioned signal based on the LOI signal with the first duty-cycle, LOQ signal with the first duty-cycle, and values of the In-phase digital control word (I) and the Quadrature digital control word (Q); or to generate a conditioned signal based on the LOI signal with the first duty-cycle, the LOI signal with the first duty-cycle, the LO signal with the second duty-cycle, or the constant voltage, and values of the In-phase digital control word (I) and the Quadrature digital control word (Q).

The digital quadrature modulator described in FIG. 5b and FIG. 6b, which allows the use of a single array of switched-capacitors instead of dedicated I and Q arrays, can be applied to the other output topologies, for example to the switch-array output topology. In that case the switched-capacitor arrays in 508b and 608b would be switch-arrays, and a conditioned signal would be controlling a unit switch gate.

Figure 7A:
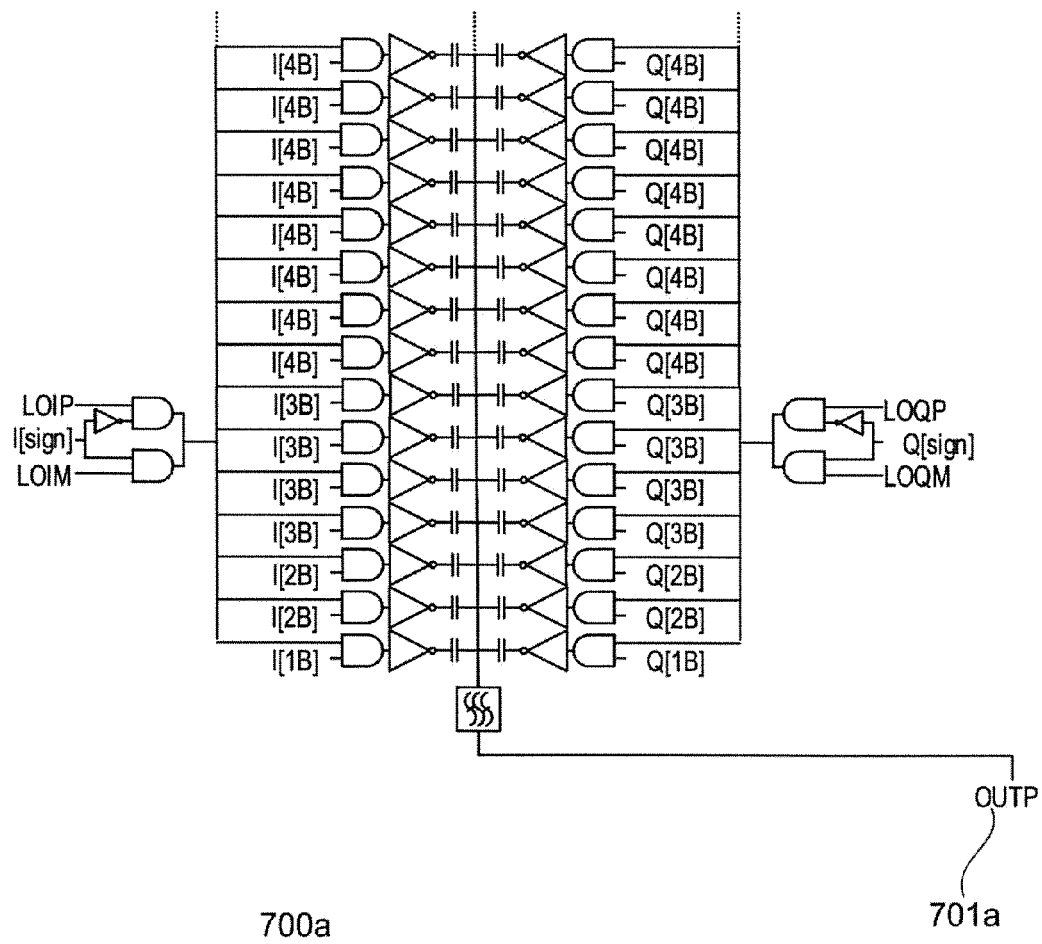
FIGS. 7a and 7b are circuit diagrams illustrating the use of two switched-capacitor digital quadrature modulators for a differential IQ-RF-DAC.
Figure 7B:
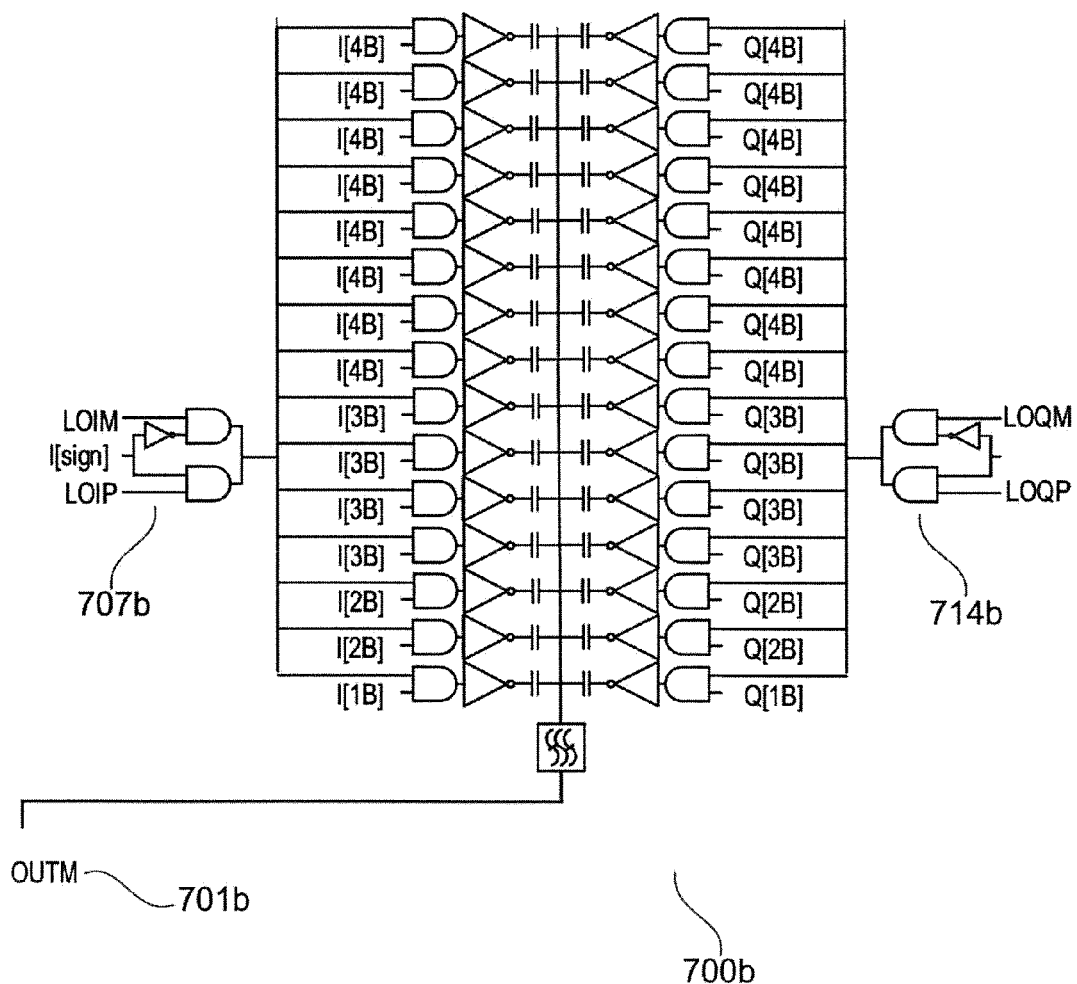

It is also within the scope of the present invention to provide a switched-capacitor differential IQ-RF-DAC. This is illustrated in FIGS. 7a and 7b which show the use of two switched-capacitor digital quadrature modulators 700a, 700b for a differential IQ-RF-DAC. The modulator 700a of FIG. 7a is identical to the modulator 400 of FIG. 4, and provides a first, positive output signal 701a (OUTP) for the differential converter. The modulator 700b of FIG. 7b is also identical to the modulator 400 of FIG. 4, but with the exception that the LOIP and LOIM oscillator input signals have been swapped when being input to the In-phase polarity selection circuit 707b, corresponding to circuit 407 of modulator 400 of FIG. 4, and the LOQP and LOQM oscillator input signals have also been swapped when being input to the Quadrature polarity selection circuit 714b, corresponding to circuit 414 of modulator 400 of FIG. 4, whereby the modulator of FIG. 7b provides a second, opposite polarity output signal 701b (OUTM) for the differential converter.

Figure 8A:
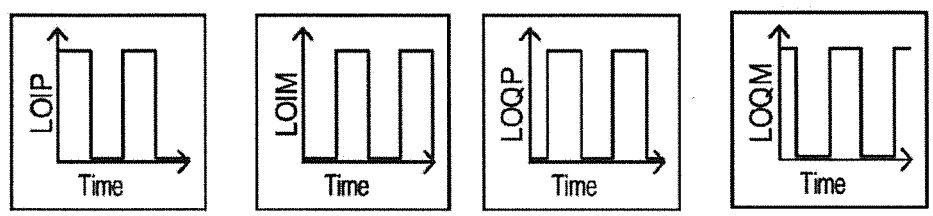
FIGS. 8a and 8b illustrate different duty cycles of local oscillator signals.
Figure 8B:
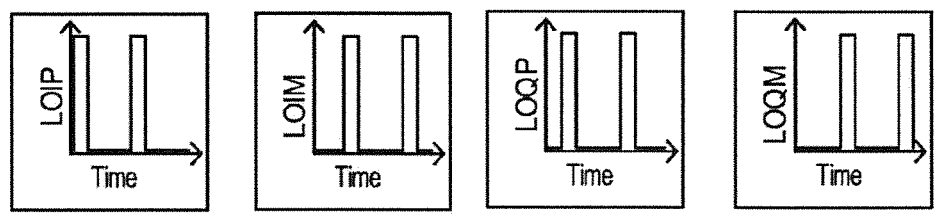

It is possible to use any LO duty-cycle, e.g., 50% or 25%. Local oscillator signals, LOIP, LOIM, LOQP, LOQM, with different duty cycles are illustrated as a function of time in FIGS. 8a and 8b. The signals of FIG. 8a have an overlapping duty cycle of 50%, where the LOIP signal overlaps with the LOQM signal, and the LOIM signal overlaps with the LOQP signal, while the signals of FIG. 8b have a non-overlapping duty cycle of about 25%, whereby none of the LO signals, LOIM, LOIP, LOQM and LOQP, overlaps.

The back-off power added efficiency (PAE) can be improved further by applying switched-capacitor units having selectable supply voltages. Having several selectable supply voltages for the same switched-capacitor unit may compromise the efficiency of the switched-capacitor unit, since the ON-resistances and parasitic capacitances unavoidably increases somewhat. But at least two selectable supply voltages can be implemented without increasing the parasitic capacitances too much.

Figure 9:
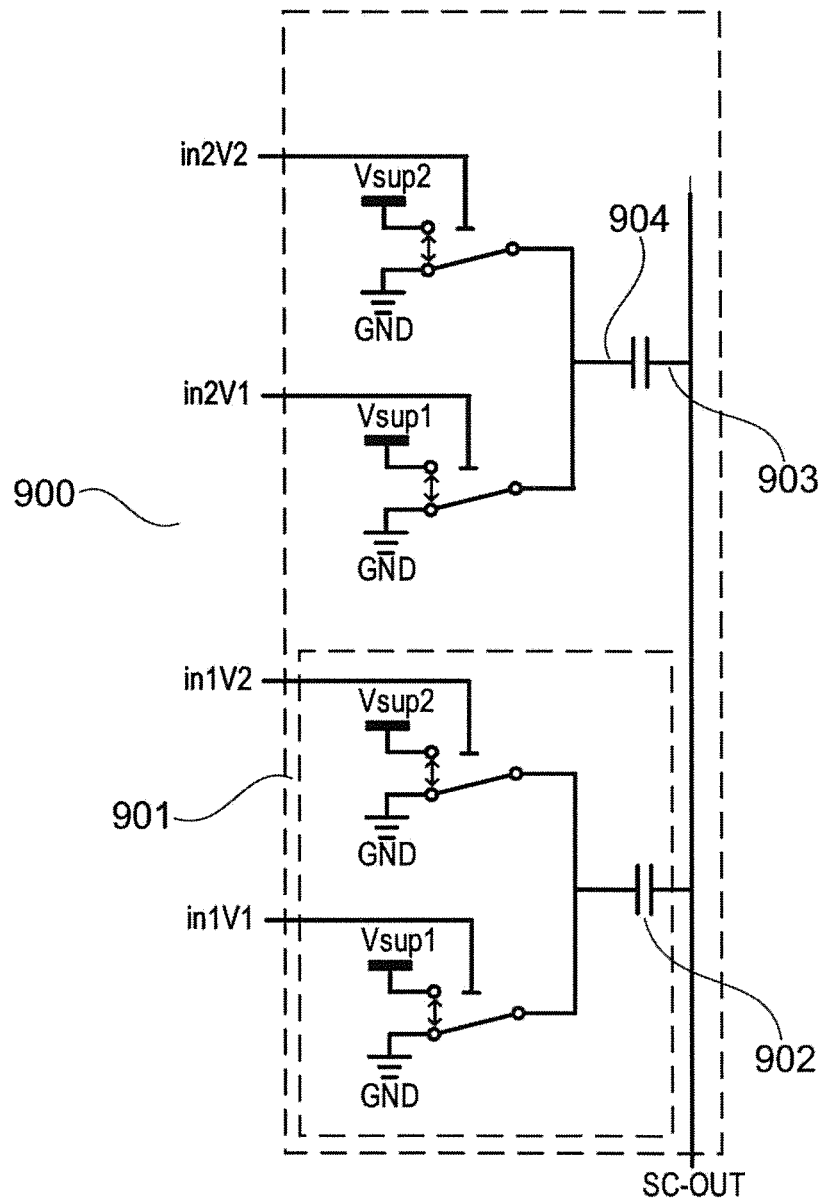
FIG. 9 illustrates a switched-capacitor array comprising switched-capacitor units with two supply voltages according to an embodiment of the invention.

FIG. 9 illustrates a switched-capacitor array 900 comprising switched-capacitor units 901 with two supply voltages. In FIG. 9 each switched-capacitor unit has an output capacitor 902 with an output 903 and an input side 904, and the input side 904 of the output capacitor 902 can be controlled by a first input control signal in1V1, in2V1 and a second input control signal in1V2, in2V2 to be active switching between a first supply voltage, Vsup1, and ground, GND, or active switching between a second supply voltage, Vsup2, and ground, GND, or the input side of the capacitor can be passive fixed to either the first supply, Vsup1, the second supply, Vsup2, or ground, GND.

To increase the output power of a switched capacitor IQ-RF-DAC further without too large loss in the impedance transformation network, higher voltage switched-capacitor units e.g., based on 3V thick-oxide IO devices or stacked thin-oxide devices, would be highly effective. The optimum RF power added efficiency (PAE) may be obtained when the maximum portion of the switched capacitors are switching, so instead of having additional 3V switched capacitor units, the 3V units could be swappable with 2V units by using an additional off-mode. The capacitance seen from the output in the off-mode should ideally be zero, but actually there is some parasitic capacitance to ground from the capacitor itself and from the transistor drains. The additional capacitance from the off-units may attenuate the output slightly. Having switched-capacitor units with an off-mode may be useful also for adjusting the total output capacitance of the switched-capacitor array, and thus adjusting the center frequency. Also the off-mode capacitors can be used for IQ-RF-DAC linearization by compensating an unwanted code-dependent total output capacitance change.

Figure 10:
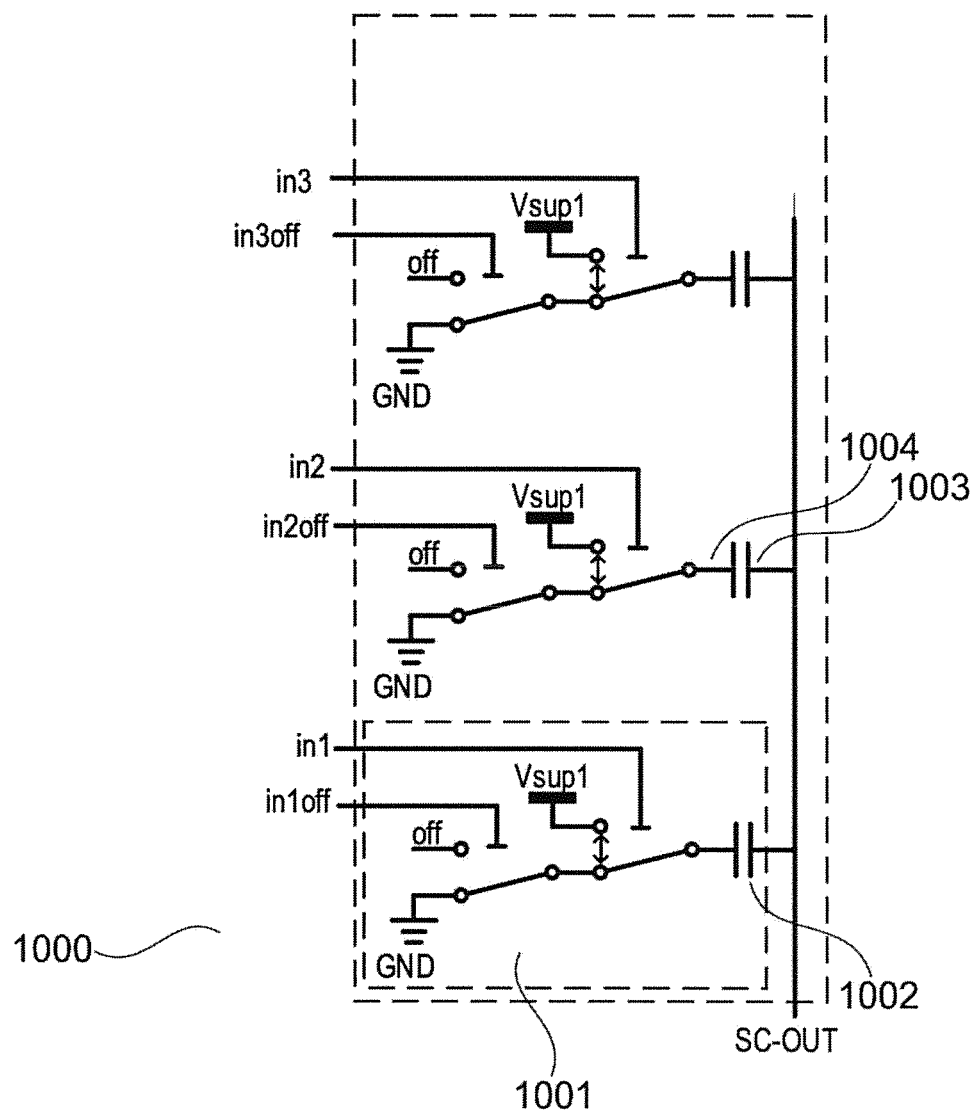
FIG. 10 illustrates a switched-capacitor array comprising switched-capacitor units with off-state operation modes according to an embodiment of the invention.

FIG. 10 illustrates a switched-capacitor array 1000 comprising switched-capacitor units 1001 with off-state operation modes according to an embodiment of the invention. In FIG. 10 each switched-capacitor unit 1001 has an output capacitor 1002 with an output 1003 and an input 1004, and the input side 1004 of the output capacitor 1002 can be controlled by a first input control signal in1, in2, in3 and a second input control signal in1off, in2off, in3off to be active switching between a supply voltage, Vsup1, and ground, GND, or the input side of the capacitor can be passive fixed to the first supply, Vsup1, or ground, GND. Furthermore, the input side 1004 can be brought in a floating off-mode. When in the active or passive mode, the output capacitance is substantial equal to the capacitance of the output capacitor 1002, and when in the off-mode the output capacitance is substantially floating with a small parasitic output capacitance close to zero.

Figure 11:
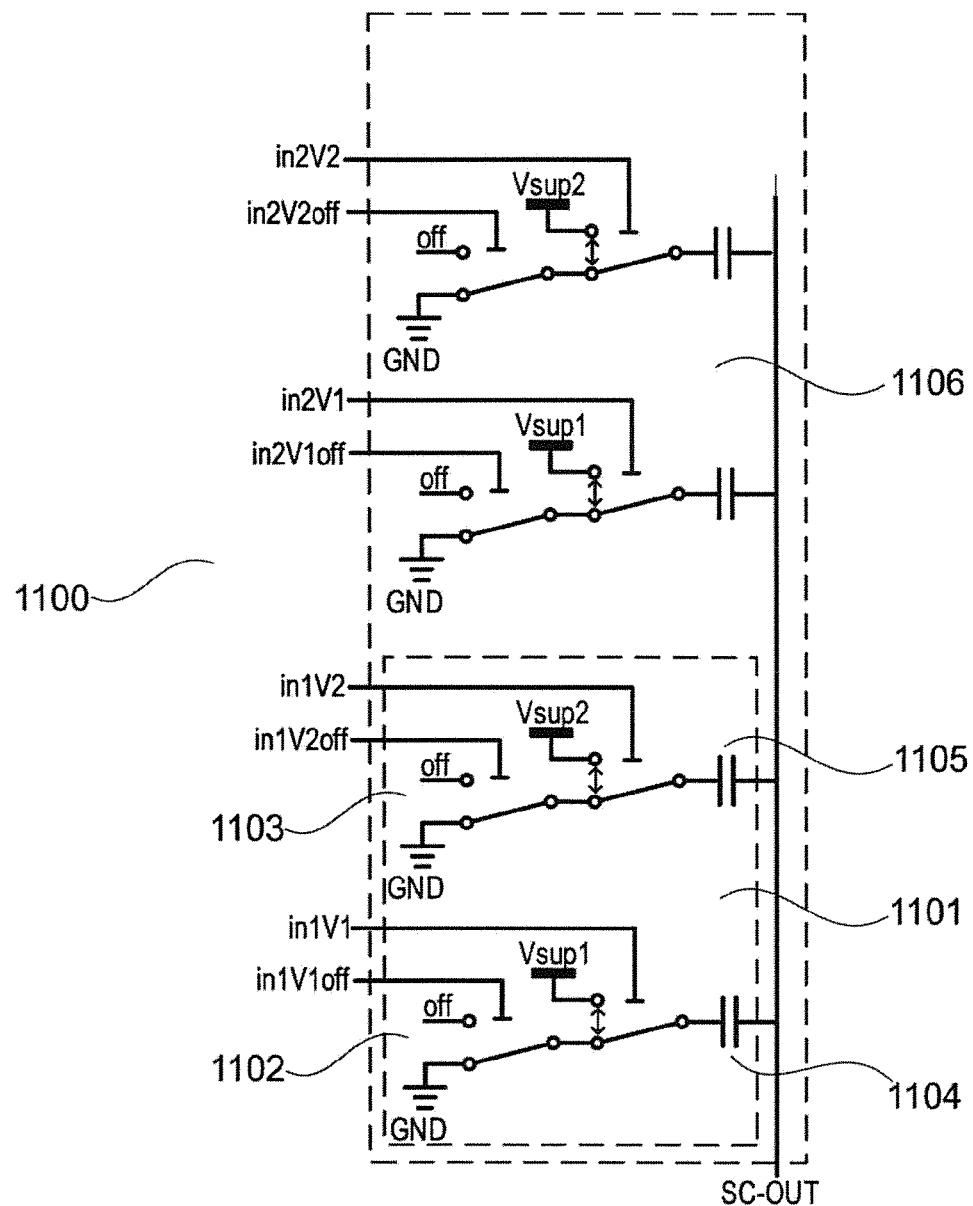
FIG. 11 illustrates a switched-capacitor array comprising switched-capacitor units having off-state operation modes and being swappable between two supply voltages according to an embodiment of the invention.

FIG. 11 illustrates a switched-capacitor array 1100 comprising switched-capacitor units 1101, 1106 having off-state operation modes and being swappable between two supply voltages, Vsup1 and Vsup2, according to an embodiment of the invention. The unit 1101 comprises two switched-capacitor units of the type illustrated in FIG. 10. A first off-mode unit 1102 having a first supply voltage Vsup1, a first output capacitor 1104, and a first input control signal in1V1 and a second input control signal in1V1off. The second off-mode unit 1103 has a second supply voltage Vsup2, a second output capacitor 1105 of equal size as capacitor 1104, and a first input control signal in1V2 and a second input control signal in1V2off. The total output capacitance of the unit 1101 is determined by the operational mode of the first and second off-mode units 1102 and 1103. The unit 1106 of FIG. 11 is similar to unit 1101, and has a first off-mode unit with a first input control signal in2V1 and a second input control signal in2V1off, and a second off-mode unit with a first input control signal in2V2 and a second input control signal in2V2off.

If one of the off-mode units 1102 and 1103 is in the off-mode, and the other unit is in the active or passive mode, the output capacitance is substantial equal to the capacitance of one of the output capacitors 1104 or 1105. If both the off-mode units 1102 and 1103 are either in the active or passive mode, the output capacitance of unit 1101 is substantial twice the capacitance of one of the output capacitors 1104 or 1105, and if both the off-mode units are in the off-mode, the output capacitance of unit 1101 is floating and close to zero.

Figure 12A:
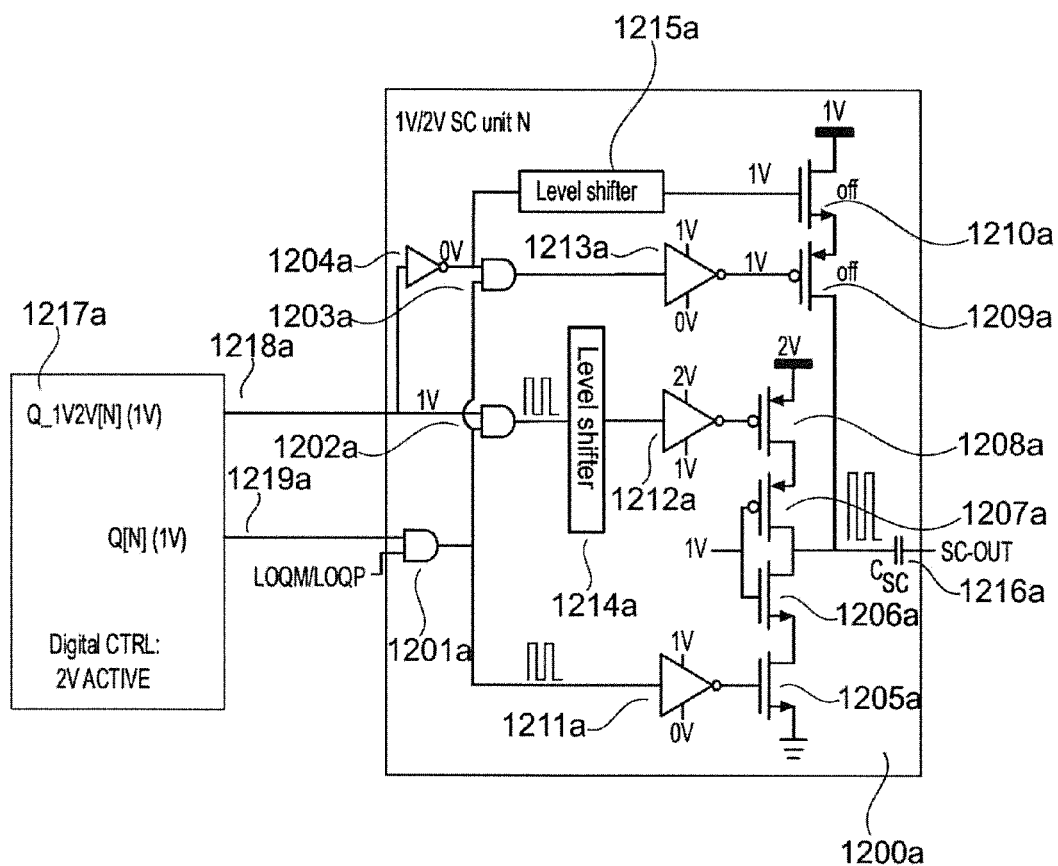
FIGS. 12a and 12b show circuit diagrams illustrating a switched-capacitor unit having two selectable supply voltages in accordance with an embodiment of the invention.
Figure 12B:
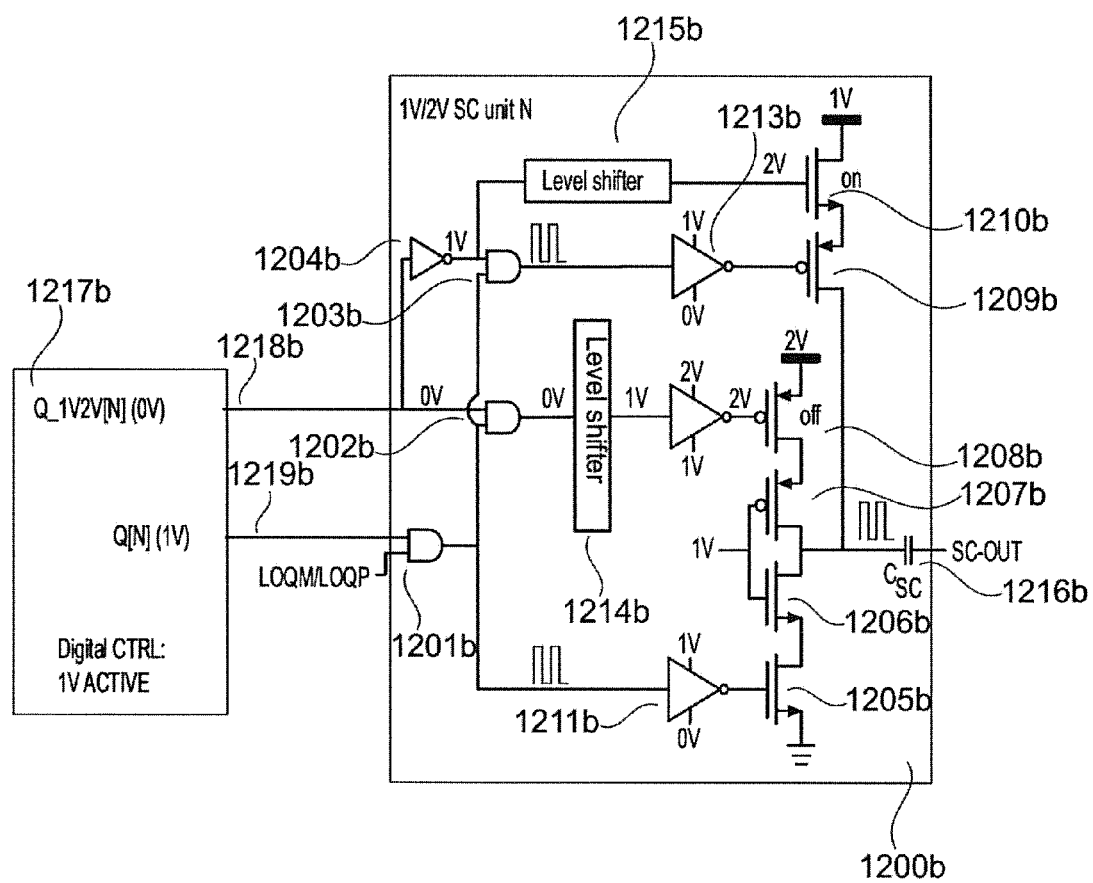

FIGS. 12a and 12b show circuit diagrams illustrating a multi-voltage switched-capacitor unit 1200a, 1200b of the type described in connection with FIG. 9, having two selectable supply voltages. In FIG. 12a the unit 1200a is controlled to switch between a second supply voltage 2V and ground, and in FIG. 12b the unit 1200b is controlled to switch between a first supply voltage 1V and ground. The switched-capacitor unit 1200a, 1200b is configured as a 1V/2V Class-G supply unit.

The switched-capacitor unit 1200a,b includes input selection circuitry with logic elements 1201a,b, 1202a,b, 1203a,b, and 1204a,b. The unit 1200a,b also includes switch circuitry with switch elements 1205a,b, 1206a,b, 1207a,b, 1208a,b, 1209a,b, and 1210a,b and switch driving elements 1211a,b, 1212a,b, and 1213a,b. The unit 1200a,b further includes voltage level shifters 1214a,b, and 1215a,b and an output capacitor 1216a,b ($C_{SC}$.

In order to use the switched-capacitor unit 1200a,b in a modulator or converter of the present invention, the modulator or converter may comprise voltage selection circuitry configured to select the supply voltage of the multi-voltage capacitor units 1200a,b in accordance with one or more received supply voltage selection signals. This is shown in FIGS. 12a, 12b, where the circuit diagrams include voltage selection circuitry 1217a,b, having a voltage selection signal 1218a,b, Q_1V2V[N] being input to logic elements 1202a,b and 1204a,b, where 1202a,b is connected to level shifter 1214a,b and 1203a,b is connected to level shifter 1215a,b. The voltage selection circuitry 1217a,b further provides an baseband signal 1219a,b being input to logic AND gate 1201a,b, with the other input to 1201a,b being a local oscillator signal 1219a,b, LOQM/LOQP. The signal 1219a,b determines whether the switched-capacitor unit 1200a,b is enabled to switch at the local oscillator frequency or not, and the signal 1218a,b determines if the unit 1200a,b is switching between 2V and ground or between 1V and ground. In FIG. 12a, both 1218a and 1219a are high, and unit 1200a is switching between 2V and ground, while in FIG. 12b, signal 1218a is low, and 1219a is high, and unit 1200b is switching between 1V and ground.

Figure 13A:
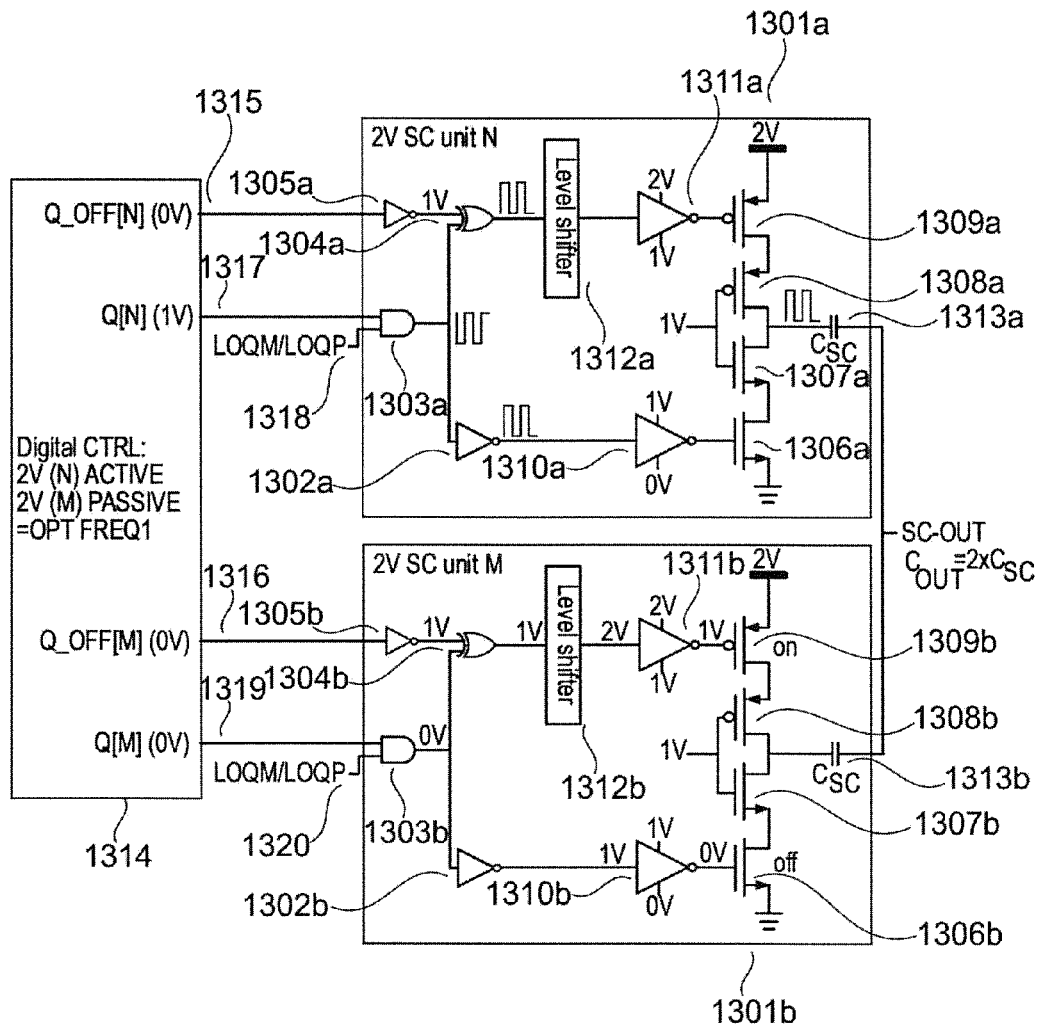
FIGS. 13a and 13b show circuit diagrams illustrating the use of switched-capacitor units with off-state mode for adjusting output capacitance of a switched-capacitor array in accordance with an embodiment of the invention.
Figure 13B:
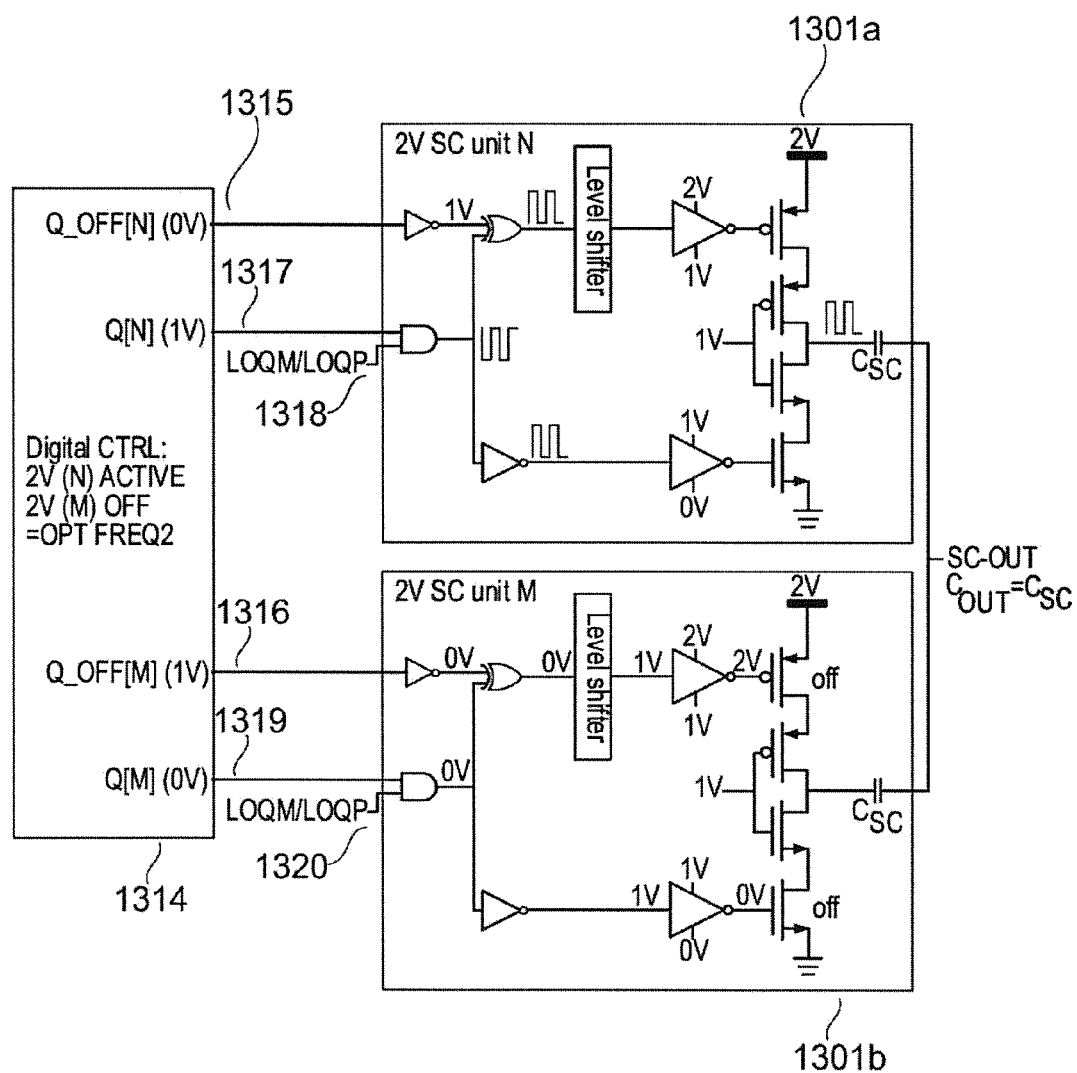

FIGS. 13a and 13b show circuit diagrams illustrating the use of switched-capacitor units 1301a and 1301b with off-state mode for adjusting output capacitance of a switched-capacitor array. The units 1301a and 1301b are off-mode types as illustrated in FIG. 10, but configured to operate with a 2V supply voltage being twice the normal supply voltage of 1V. Each switched-capacitor unit 1301a,b includes input selection circuitry with logic elements 1302a,b, 1303a,b, 1304a,b, and 1305a,b. The units 1301a,b also include switch circuitry with switch elements 1306a,b, 1307a,b, 1308a,b, and 1309a,b, and switch driving elements 1310a,b, and 1311a,b. The units 1301a,b further include a voltage level shifter 1312a,b in order to operate at a 2V supply voltage, and an output capacitor 1313a,b, $C_{SC}$.

In order to use the switched-capacitor units 1301a and 1301b in a modulator or converter of the present invention, the modulator or converter may comprise operation mode control circuitry configured to control the operation mode of the off-mode capacitor units 1301a, 1301b. In FIGS. 13a, 13b the circuit diagrams include operation mode control circuitry 1314, having off-mode control signal 1315, Q_OFF[N], for unit 1301a and off-mode control signal 1316, Q_OFF[M], for unit 1301b. The operation mode control circuitry 1314 further provides a baseband signal 1317, Q[N], being input to logic AND gate 1303a of unit 1301a, with the other input to 1303a of 1301a being a local oscillator signal 1318, LOQM/LOQP. The operation mode control circuitry 1314 also provides a baseband signal 1319, Q[M], being input to logic AND gate 1303b of unit 1301b, with the other input to 1303b of 1301b being a local oscillator signal 1320, LOQM/LOQP. The off-mode control signals 1315, 1316 and the baseband signals 1317, 1319 determine whether the units 1301a, 1301b are in off-mode, active mode or passive mode.

In FIG. 13a the signal 1315 is low, while the signal 1317 is high, so unit 1301a is in the active mode. Signal 1316 is low and signal 1319 is also low, so unit 1301b is in the passive mode. While none of the units 1301a and 1301b are in the off-mode, the total output capacitance of the connected output capacitors 1313a,b of units 1301a and 1301b is twice the capacitance of one output capacitor 1313a,b. In FIG. 13b the signal 1315 is low, while the signal 1317 is high, so unit 1301a is also here in the active mode. Signal 1316 is high, and signal 1319 is low, whereby the inputs to XOR gate 1304b are both low, and the unit 1301b is in the off-mode. While for FIG. 13b unit 1301a is in the active mode and unit 1301b is in the off-mode, the total output capacitance of the connected output capacitors 1313a,b of units 1301a and 1301b is substantial equal to the capacitance of one output capacitor 1313a,b. When comparing FIGS. 13a and 13b, then for both figures unit 1301a is active switching and unit 1301b is non-switching. But in FIG. 13a unit 1301b is in the passive mode and contributing with the output capacitance of capacitor 1313b, while in FIG. 13a unit 1301b is in the off-mode and contributing with an output capacitance of substantially zero.

Having a part of the switched-capacitor units controlled to be in the off-mode as illustrated in FIG. 13b instead of in the passive mode as illustrated in FIG. 13a can be useful for frequency tuning. Having a part of the switched capacitor units controlled to be in the off-mode can also be used in order to compensate for system nonlinearity. FIGS. 13a and 13b illustrate how the output capacitance can be changed by using a single pair of switched capacitor units, but for a modulator, converter or switched-capacitor array of the present invention, hundreds or thousands of switched-capacitor units may be controlled to be in the off-mode in order to tune the frequency response or to compensate for system nonlinearity.

Figure 14A:
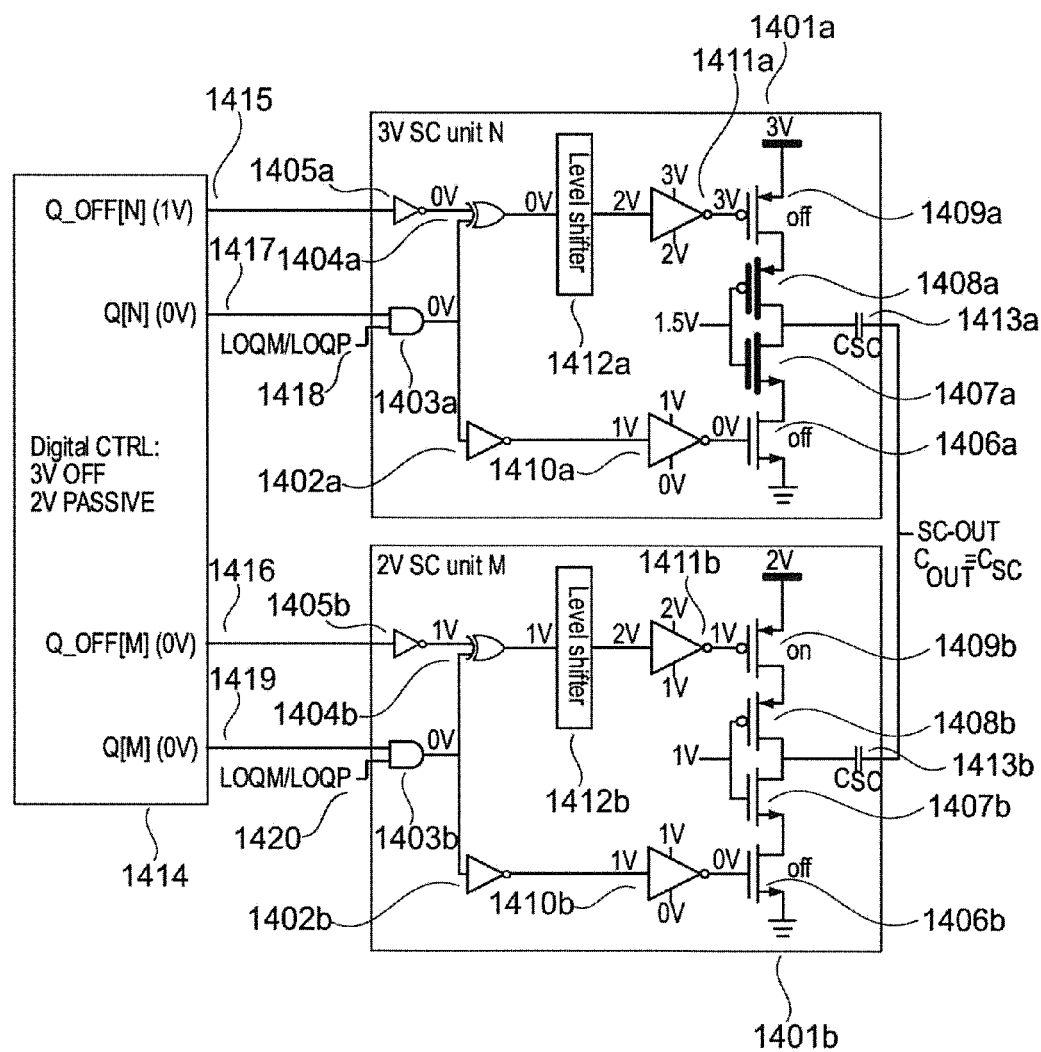
FIGS. 14a,b,c show circuit diagrams illustrating the use of swappable switched-capacitor units with off state mode for swapping between units of two different supply voltages in accordance with an embodiment of the invention.

FIGS. 14a,b,c show circuit diagrams illustrating the use of swappable switched-capacitor units 1401a and 1401b with off-state mode for swapping between units of two different supply voltages 1401 and 1401b in accordance with an embodiment of the invention. The units 1401a and 1401b are off-mode types as illustrated in FIG. 10, but configured to operate with a higher supply voltage than the normal supply voltage being 1V. Unit 1401b is identical to units 1301a and 1301 b of FIG. 13 with a 2V supply voltage being twice the normal supply voltage, while unit 1401a has 3v supply voltage being three times the normal supply voltage. Each switched-capacitor unit 1401a,b includes input selection circuitry with logic elements 1402a,b, 103a,b, 1404a,b, and 1405a,b. The units 1401a,b also include switch circuitry with switch elements 1406a,b, 1407a,b, 1408a,b, and 1409a,b, and switch driving elements 1410a,b, and 1411a,b. The units 1401a,b further include a voltage level shifter 1412a,b in order to operate at 3V and 2V supply voltage, respectively, and an output capacitor 1413a,b of capacitance $C_{SC}$.

Figure 14B:
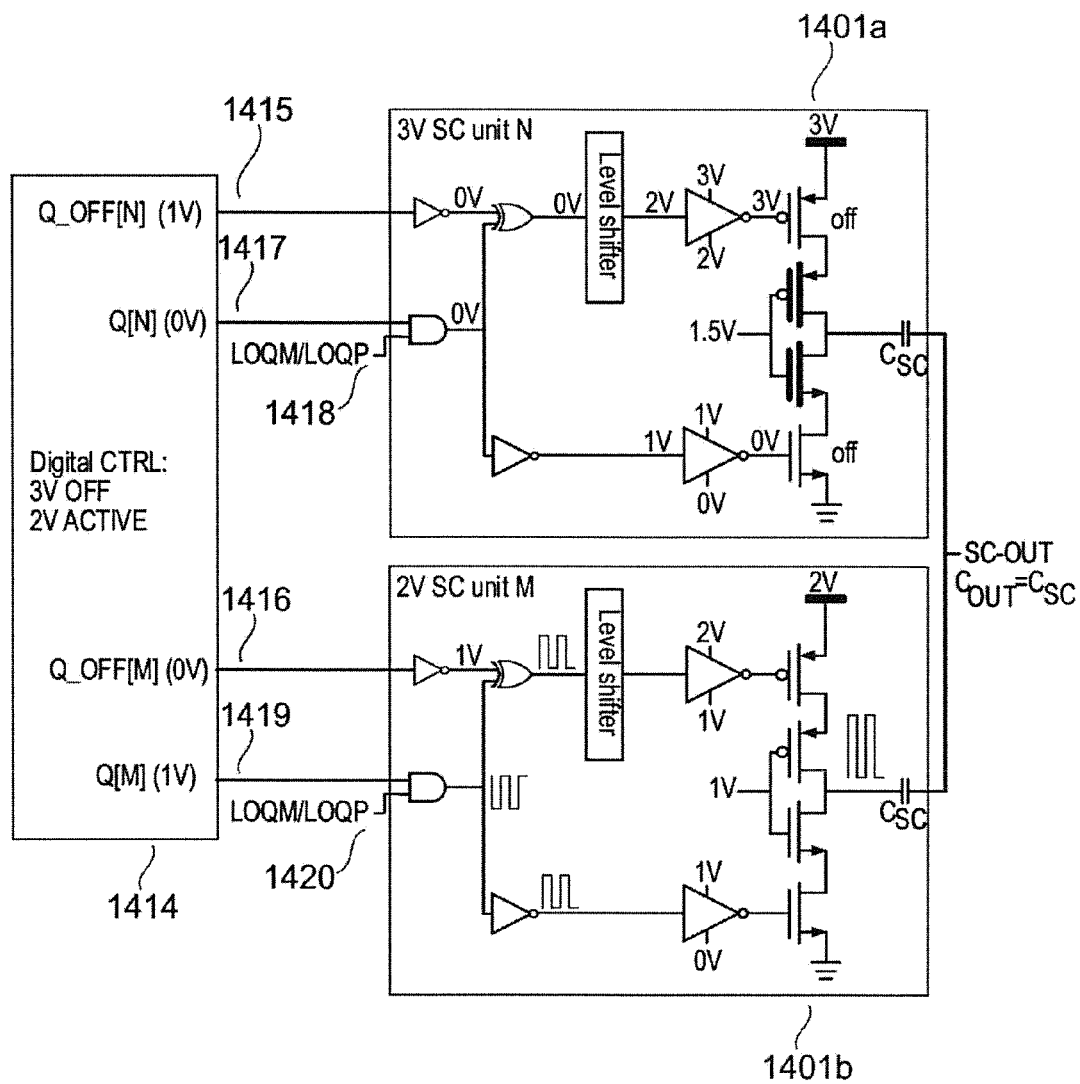

Also here, operation mode control circuitry configured to control the operation mode of the off-mode capacitor units 1401a, 1401b is provided. In FIGS. 14a, 14b the circuit diagrams include operation mode control circuitry 1414, having off-mode control signal 1415, Q_OFF[N], for unit 1401a and off-mode control signal 1416, Q_OFF[M], for unit 1401b. The operation mode control circuitry 1414 further provides a baseband signal 1417, Q[N], being input to logic AND gate 1403a of unit 1401a, with the other input to 1403a of 1401a being a local oscillator signal 1418, LOQM/LOQP. The operation mode control circuitry 1414 also provides a baseband signal 1419, Q[M], being input to logic AND gate 1403b of unit 1401b, with the other input to 1403b of 1401b being a local oscillator signal 1420, LOQM/LOQP. The off-mode control signals 1415, 1416 and the baseband signals 1417, 1419 determine whether the units 1401a, 1401b are in off-mode, active mode or passive mode.

Figure 14C:
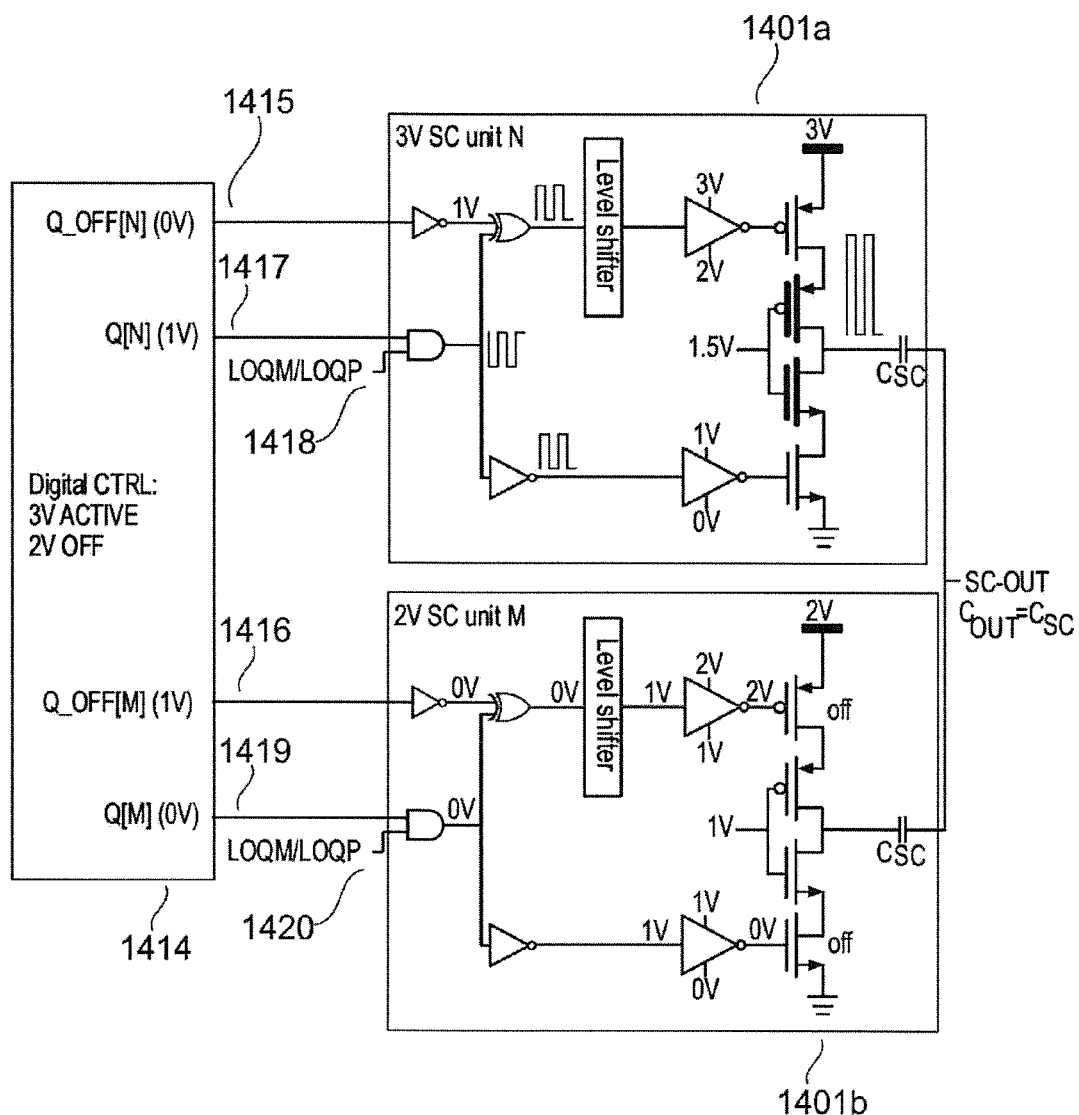

In FIG. 14a signal 1415 is high and 1417 is low bringing unit 1401a in the off-mode. Signal 1416 is low, and signal 1419 is also low bringing unit 1401b in the passive mode. With one unit of FIGS. 14a being in the off-mode, the total output capacitance of the connected output capacitors 1413a,b of units 1401a and 1401b is substantial equal to the capacitance of one output capacitor 1413a,b, $C_{OUT}$ equal to $C_{SC}$. In FIG. 14b signal 1415 is high and 1417 is low bringing unit 1401a is in the off-mode. Signal 1416 is low, and signal 1419 is high low bringing unit 1401b is in the active mode. With one unit of FIGS. 14b being in the off-mode, the total output capacitance of the connected output capacitors 1413a,b of units 1401a and 1401b is substantial equal to the capacitance of one output capacitor 1413a,b, $C_{OUT}$ equal to $C_{SC}$. In FIG. 14b, the 2V switched capacitor unit 1401b is active giving a voltage swing between ground and 2V. In FIG. 14c signal 1415 is low and 1417 is high bringing unit 1401a is in the active mode. Signal 1416 is high, and signal 1419 is low bringing unit 1401b is in the off-mode. With one unit of FIGS. 14c being in the off-mode, the total output capacitance of the connected output capacitors 1413a,b of units 1401a and 1401b is substantial equal to the capacitance of one output capacitor 1413a,b, $C_{OUT}$ equal to $C_{SC}$. In FIG. 14c, the 3V switched capacitor unit 1403b is active giving a voltage swing between ground and 3V. When comparing FIGS. 14b and 14c, then for both figures the output capacitance is substantial equal to the capacitance of one output capacitor 1413a,b, $C_{SC}$, but the active units 1401a and 1401b are swapped or switched, whereby from FIG. 14b to FIG. 14c, the voltage swing is changed from 2V to 3V. FIG. 14a illustrates that when one of the units 1401a or 1401b is in the off-mode and the other unit is in the passive mode, the output capacitance is still substantial equal to the capacitance of one output capacitor 1413a,b ($C_{SC}$).

FIGS. 14a,b,c illustrate how a pair of switched-capacitor units of different supply voltages can replace each other without changing the output capacitance by having the off-mode. For a modulator, converter or switched-capacitor array of the present invention, hundreds or thousands of switched-capacitor units of a low supply voltage may be switched or swapped with an equal number of switched-capacitor units of a higher supply voltage in order to increase the output power without having too large a loss in the impedance transformation network.

In FIGS. 14a,b,c the low voltage unit 1401b has a 2V supply voltage, but it is also within embodiments of the present invention that the low voltage unit 1401b can be replaced by a multi-voltage switched-capacitor unit 1200a,b as described in connection with FIGS. 12a and 12b. In this case the operation mode control circuitry 1414 of FIGS. 14a,b,c would then further be provided with the voltage selection signal Q_1V2V[N], 1218a,b of FIGS. 12a,b, which is input to logic elements of the input selection circuitry of the unit 1401b, where additional logic elements should be added to enable the unit 1401b to have each of the two voltage modes controlled to be in the off-mode, passive mode or active mode.

Figure 15:
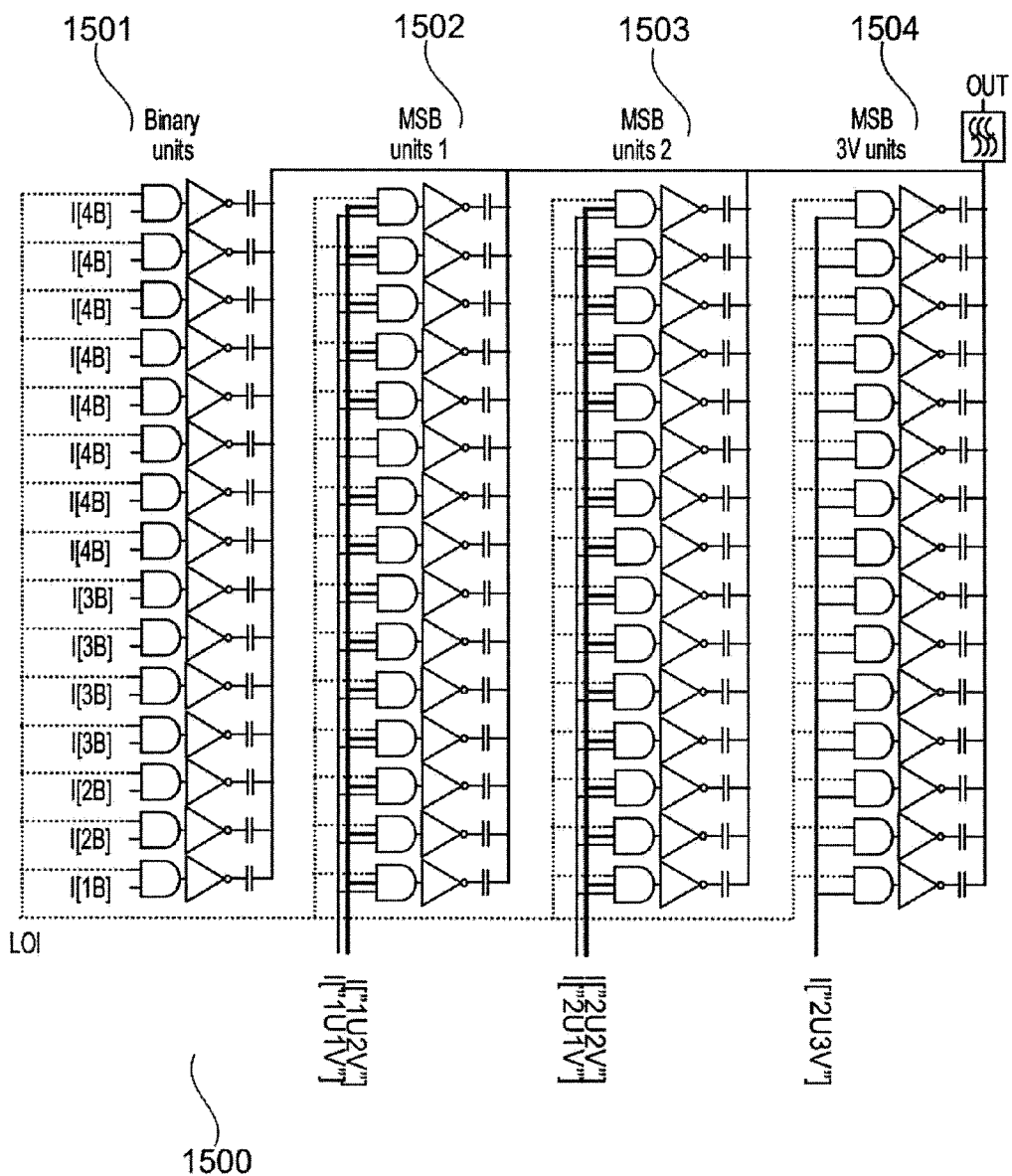
FIG. 15 is an overview diagram illustrating a switched-capacitor modulator according to an embodiment of the invention, the switched-capacitor modulator including arrays with single supply voltage switched-capacitor units, two supply voltage switched-capacitor units, and pairs of swappable switched-capacitor units.

FIG. 15 is an overview diagram illustrating an I-branch of a switched-capacitor modulator 1500 used in a digital quadrature modulator according to an embodiment of the invention. The switched-capacitor modulator 1500 includes a first array 1501 of single supply voltage switched-capacitor units having a supply voltage of 1V, a second array 1502 of two supply or multi-voltage switched-capacitor units having supply voltages of 1V and 2V, an array 1503 of two supply or multi-voltage and swappable switched-capacitor units having supply voltages of 1V and 2V, and an array 1504 of high voltage swappable switched-capacitor units having supply voltage of 3V. The number of units of the array 1503 equals the number of units of the array 1504, and the units of array 1503 can be swapped or switched with the units of array 1504, so that half the total units of arrays 1503 and 1504 will be in the off-mode, while the other half will be in the active or passive mode.

Figure 16:
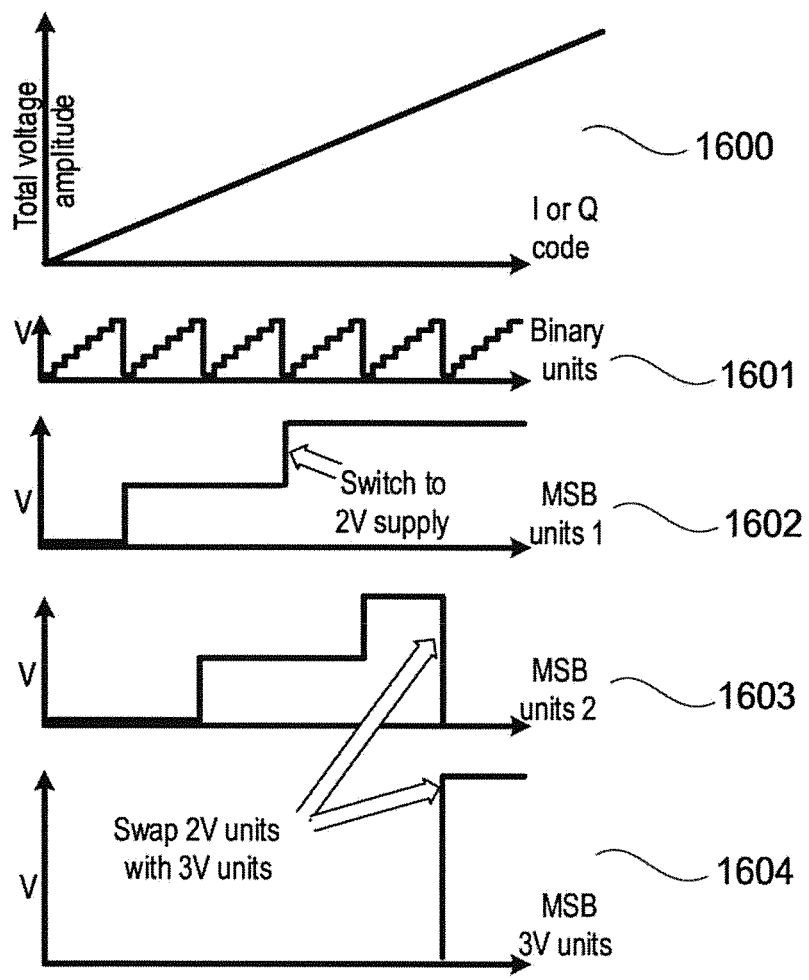
FIG. 16 shows voltage diagrams illustrating change in output voltage for the arrays of the modulator of FIG. 15.

FIG. 16 shows diagrams illustrating change in output voltage for the switched-capacitor arrays of FIG. 15. The total amplitude of the array 1500 is the linear output amplitude as shown in 1600, where the total amplitude 1600 is the sum of the amplitudes of the arrays 1501, 1502, and 1503 or 1504, where the amplitude of array 1501 is shown by 1601, of array 1502 is shown by 1602, of array 1503 is shown by 1603, and of array 1504 is shown by 1604.

When looking at the block diagram 300 of FIG. 3, the arrays 1501-1504 of FIG. 15 correspond to the 'LO control logic', 307 and the 'switched-capacitor units', 308. Each of the arrays 1501-1504 have as inputs the local oscillator signal LOI, and further has as input signal bits from the digital In-phase baseband signal, I, being coded by the coding circuitry 305. A complete modulator would have an equal Quadrature branch.

The first array 1501 may be configured as the modulator of FIG. 4, with the units having a single supply voltage. The units of array 1501 may be binary-coded as the 4 least significant bits, LSB, in order to reduce the routing complexity. The units of the remaining arrays 1502, and 1503/1504 may be unary coded (thermo-coded), meaning that equal size group of units are activated and represent most significant bits (MSB). In this case there are three equal size MSB sets, with 1V/2V units 1502 corresponding to MSB units 1, swappable 1V/2V units 1503 corresponding to MSB units 2, and 3V units 1504 corresponding to MSB 3V units being swappable with MSB units 2 1503.

An important point in switched-capacitor topology is that the switched-capacitor unit output capacitance is constant regardless whether the unit is active switching between supply, Vdd, and ground, GND, or if it is passive, GND or Vdd. But when the unit is in the off-mode, the output capacitance is nearly zero. So, one switched-capacitor unit or group of units can be set invisible by setting the unit(s) to off-mode. When the input code I is zero, all 1V or 1V/2V units of arrays 1501-1503 are passive and the 3V units of array 1504 are set invisible in the off-mode. When the input code, I, is increased, the output voltage amplitude needs to be increased and the 1V units of array groups 1501 (LSB), 1502 (MSB units 1), and 1503 (MSB units 2) are gradually activated for switching between GND and 1V. When all units of arrays 1501-1503 are switching between GND and 1V, and the output amplitude still needs to be increased, the units of array 1502 are gradually set to switch between GND and 2V, followed by the units of array 1503 being set to switch between GND and 2V. When all units of arrays 1502 and 1503 have been set to switch with 2V amplitude, the 2V switching units of the array 1503 are set to the off-mode and an equal number of 3V units of the array 1504 are activated from the off-mode to switch between GND and 3V.

For linear operation it is critical that the sum of the capacitance seen from the output remains as constant as possible all the time. The power added efficiency of the swappable high voltage units in the array 1504 can be worse than the lower voltage units in the array 1503, but this can be allowed since the swappable units are used only during signal envelope peaks. The signal envelope peaks can be very rare so the use of swappable units may not contribute much to the average power consumption, but it may be needed to support the signal peaks.

It is within an embodiment of the invention that a first and a second switched-capacitor array/modulators/IQ-RF-DACs configured as the modulator of FIG. 15 are provided having their output combined, and when the units of the first modulator have been activated or set in the off-mode according to the procedure described above, the procedure may be repeated for the second modulator in order to further increase the output amplitude.

Figure 17:
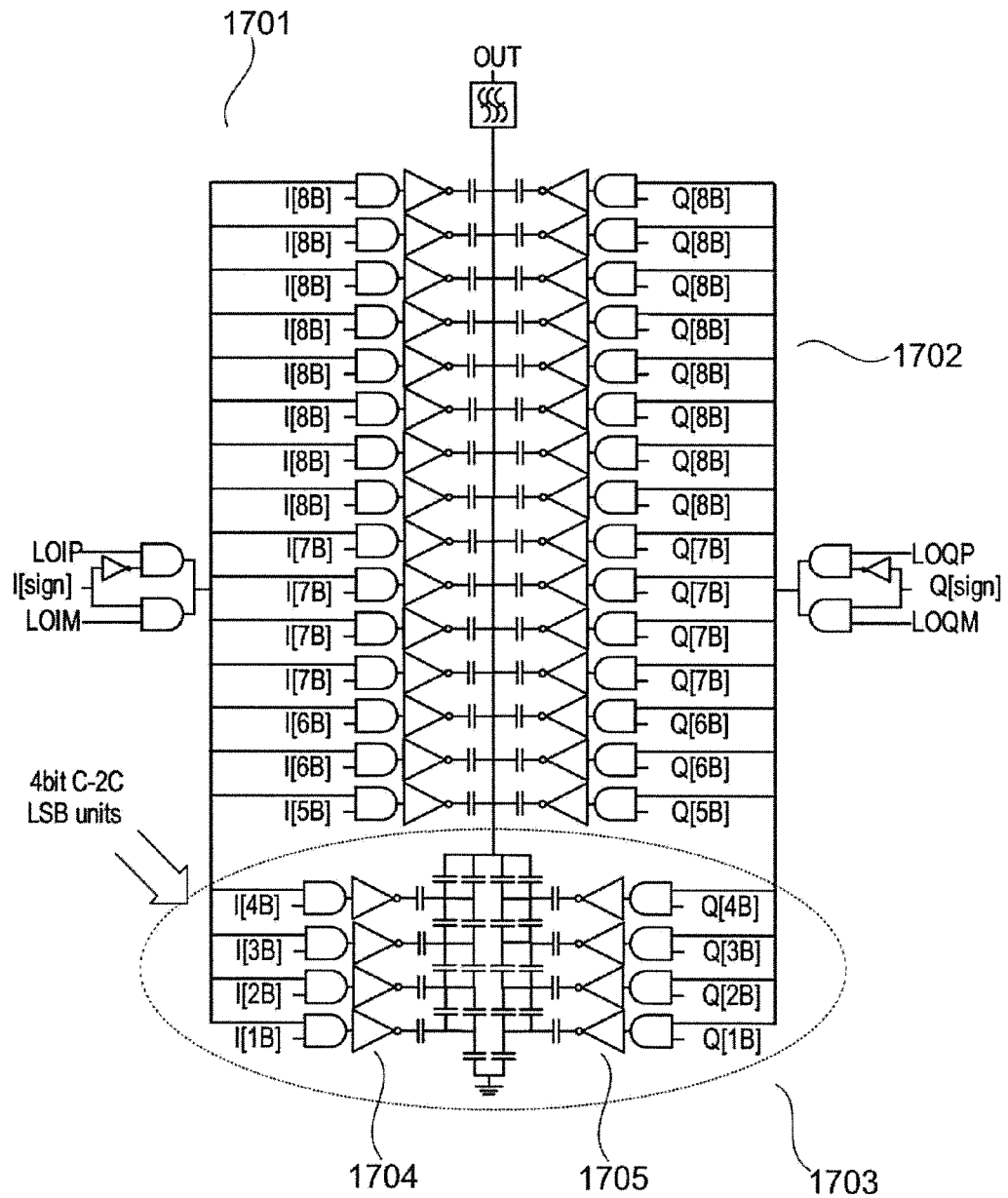
FIG. 17 is a diagram illustrating the use of C-2C switched-capacitor units to increase resolution of a switched-capacitor IQ-RF-DAC, according to an embodiment of the invention.

FIG. 17 is a diagram illustrating the use of C-2C switched-capacitor arrays to increase resolution of a switched-capacitor IQ-RF-DAC 1701. C-2C switched-capacitor arrays can be used to increase the resolution of a switched-capacitor IQ-RF-DAC without exponentially increasing the number of units. The C-2C array can improve the resolution and thus lower the quantization noise floor with minimum number of additional switched-capacitor units. The benefit is a high improvement in quantization noise with only a few additional switched capacitor units. To increase the resolution by N bits, only N additional C-2C units are needed instead of multiplying the number of units by $2^N$. Thus, using C-2C switched-capacitor arrays may be a very efficient way to improve the IQ-RF-DAC resolution without increasing the layout burden. FIG. 17 illustrates how the number of bits of a 4-bit IQ-RF-DAC, 400 of FIG. 4, can be doubled to 8 bit with only 8 additional C-2C switched capacitor units.

The upper part of the diagram of FIG. 17 shows a switched-capacitor modulator part 1702 configured as the modulator 400 of FIG. 4, and the lower part of the diagram of FIG. 17 shows a switched-capacitor modulator part 1703 configured by use of two arrays 1704 and 1705 of C-2C switched-capacitor units. Each C-2C array 1704, 1705 is configured as a ladder network of four C-2C switched-capacitor units. The In-phase control word signal bits are input to the switched-capacitor units of the left side of the converter or modulator 1701, while the Quadrature control word signal bits are input to the switched-capacitor units on the right side of the converter or modulator 1701. The four least significant bits, LSB, of the control words are input to the two C-2C switched-capacitor ladder networks, 1704, 1705, while the following four bits of the control words are input to the switched-capacitor units of the modulator part 1702 being configured as the modulator 400 of FIG. 4.

Although the present invention has been described with reference to specific features and embodiments thereof, it is evident that various modifications and embodiments can be made thereto without departing from the spirit and scope of the invention. The specification and drawings are, accordingly, to be regarded as an illustration of the invention as defined by the appended claims, and are contemplated to cover any and all modifications, variations, combinations or equivalents that fall within the scope of the present invention.

The term "comprising" as used in the appended claims does not exclude other elements or steps. The term "a" or "an" as used in the appended claims does not exclude a plurality.

What is claimed is:

1. A digital quadrature modulator, comprising:
local oscillator circuitry configured to provide a first set of local oscillator signals with a first duty-cycle, which comprise a positive In-phase local oscillator (LOIP) signal, an opposite polarity In-phase local oscillator (LOIM) signal, a positive Quadrature local oscillator (LOQP) signal, and an opposite polarity Quadrature local oscillator (LOQM) signal;
local oscillator polarity logic circuitry configured to:
select an In-phase local oscillator (LOI) signal between the LOIP signal and the LOIM signal according to a sign bit of an In-phase digital control word (I), and select a Quadrature local oscillator (LOQ) signal between the LOQP signal and the LOQM signal according to a sign bit of a Quadrature digital control word (Q);
a number of local oscillator control logic circuits, each configured to generate a conditioned signal by gating one or both of the selected LOI and LOQ signals according to values of the In-phase digital control word (I) and/or values of the Quadrature digital control word (Q);
one or more sets of switched-capacitor units, each switched-capacitor unit having an output provided by an output capacitor, wherein a signal at the input side of the output capacitor is determined by one of the conditioned signals; and
a common node configured to combine the outputs of at least two of the switched-capacitor units.

2. The digital quadrature modulator according to claim 1, wherein:
the local oscillator circuitry is further configured to provide a second set of local oscillator signals with a second duty-cycle, which comprise a second positive In-phase local oscillator (LOIP50%) signal, a second opposite polarity In-phase local oscillator (LOIM50%) signal, a second positive Quadrature local oscillator (LOQP50%) signal, and a second opposite polarity Quadrature local oscillator (LOQM50%) signal;
the local oscillator polarity logic circuitry is further configured to select a second duty-cycle local oscillator (LO50%) signal from the set of provided second duty-cycle local oscillator signals LOIP50%, LOIM50%, LOQP50% and LOQM50% according to the sign bit of the In-phase digital control word (I) and the sign bit of the Quadrature digital control word (Q); and
at least part of the local oscillator control logic circuits are configured to generate the conditioned signal by gating the selected first duty-cycle LOI and LOQ signals and the selected second duty-cycle LO50% signal according to values of the In-phase digital control word (I) and values of the Quadrature digital control word (Q).

3. The digital quadrature modulator according to claim 1, wherein at least two of the switched-capacitor units have an output capacitor with a first capacitance value, and wherein the output of at least two switched-capacitor units with the first capacitance output value are coupled to each other through one or more series capacitors having a total second capacitance value equal to twice the first capacitance value.

4. The digital quadrature modulator according to claim 1, wherein:
part or all of the switched-capacitor units are multi-voltage switched-capacitor units, which are configured to connect with at least two supply voltages, with at least a second supply voltage being higher than a first supply voltage; and
the modulator further comprises voltage selection circuitry configured to select the supply voltage of the multi-voltage switched-capacitor units in accordance with one or more received supply voltage selection signals.

5. The digital quadrature modulator according to claim 1, wherein part or all of the switched-capacitor units are off-mode switched-capacitor units configured to have controllable operation modes including an off-mode, an active voltage switching mode, and a passive constant input voltage mode, wherein for the off-mode the input side of the output capacitor is floating with a small parasitic output capacitance, while for the active and passive modes the output capacitance is equal to a capacitance of an output capacitor of the switched-capacitor unit.

6. The digital quadrature modulator of claim 5, wherein the modulator further comprises an operation mode control circuitry configured to control the operation mode of the off-mode switched-capacitor units in accordance with one or more operation mode control signals.

7. The digital quadrature modulator of claim 5, wherein:
a first set of the off-mode switched-capacitor units are configured for having an input side of the output capacitor switching between ground and a third supply voltage when in the active mode; and
a second set of the off-mode switched-capacitor units are configured for having an input side of the output capacitor switching between ground and a fourth supply voltage when in the active mode, wherein the fourth supply voltage being higher than the third supply voltage.

8. The digital quadrature modulator of claim 6, wherein the operation mode control circuitry is configured to control the operation mode of the first and second set of off-mode switched-capacitor units so that when the operation mode of a number of the second set of off-mode switched-capacitor units are controlled to be in the off-mode, then the operation mode of an equal or greater number of the first set of off-mode switched-capacitor units are controlled to be in the passive or active mode.

9. The digital quadrature modulator of claim 8, wherein the operation mode control circuitry is configured to control the operation mode of the first and second set of off-mode switched-capacitor units so that when the operation mode of a number of the second set of off-mode switched-capacitor units are controlled to shift from off-mode to active mode, then the operation mode of an equal number of the first set of off-mode switched-capacitor units are controlled to shift from passive or active mode to off-mode.

10. The digital quadrature modulator of claim 6, wherein the operation mode control circuitry is configured to control the operation mode of the first and second set of off-mode switched-capacitor units so that when the operation mode of a number of the second set of off-mode switched-capacitor units are controlled to shift from active mode to off-mode, then the operation mode of an equal number of the first set of off-mode switched-capacitor units are controlled to shift from off-mode to passive or active mode.

11. The digital quadrature modulator of according to claim 6, wherein the operation mode control circuitry is configured to set the operation mode of a number of off-mode switched-capacitor units in the off-mode, to thereby change the overall output capacitance.

12. A radio frequency (RF) transmitter comprising:
the digital quadrature modulator in accordance with claim 1.

13. The RF transmitter of claim 12, further comprising:
a filter or matching network configured to receive the combined output signal and generate a filtered RF output therefrom.

14. The RF transmitter of claim 12, further comprising:
a power amplifier configured to receive the combined output signal or the filtered RF output and generate an amplified output therefrom.

15. A combined transmitter comprising:
a plurality of RF transmitters, each RF transmitter in accordance with claim 13 and configured to generate an output power; and
wherein the output powers of the plurality of RF transmitters are combined.

* * * * *